United States Patent [19]

Skoczen et al.

[11] Patent Number: 5,714,910
[45] Date of Patent: Feb. 3, 1998

[54] METHODS AND APPARATUS FOR DIGITAL FREQUENCY GENERATION IN ATOMIC FREQUENCY STANDARDS

[75] Inventors: Gerold L. Skoczen, Chino Hills; William F. Cashin, Jr., Laguna Niguel; Jaral Del Pasin, Valencia, all of Calif.

[73] Assignee: Efratom Time and Frequency Products, Inc., Irvine, Calif.

[21] Appl. No.: 358,832

[22] Filed: Dec. 19, 1994

[51] Int. Cl.[6] .................................................. H03L 7/26
[52] U.S. Cl. ........................................ 331/3; 331/94.1
[58] Field of Search ............................... 331/3, 94.1, 2, 331/1 R, 1 A; 327/115, 113, 261

[56] References Cited

U.S. PATENT DOCUMENTS

| | | | |
|---|---|---|---|
| 4,449,105 | 5/1984 | Frank et al. | 331/3 |
| 4,462,006 | 7/1984 | Fowks | 331/3 |
| 4,476,445 | 10/1984 | Riley | 331/3 |
| 4,692,716 | 9/1987 | De Marchi et al. | 331/3 |
| 4,740,761 | 4/1988 | Barnes et al. | 331/3 |

OTHER PUBLICATIONS

Detoma et al., *Proceedings of the 6th European Frequency and Time Forum*, 17–19 Mar. 1992, ESA SP–340, European Space Agency, pp. 457–469.

*Primary Examiner*—Robert Pascal
*Assistant Examiner*—David Vu
*Attorney, Agent, or Firm*—Brinks Hofer Gilson & Lione

[57] ABSTRACT

A physics package interrogation signal can be digitally synthesized for use in an atomic frequency standard with one or more sets of integrally-related sub-multiples of a clock frequency in which one of the integrally-related sub-multiple frequencies is varied to provide frequency modulation between integrally-adjacent sub-multiple frequencies through the use of preloadable counters, the controlled delay and the synchronization of digital pulse trains and operation in plural modes. The method and apparatus can reduce false lock possibilities, optimize the ability of the physics package to remain locked, and reduce phase noise in the output of an atomic frequency standard.

59 Claims, 15 Drawing Sheets

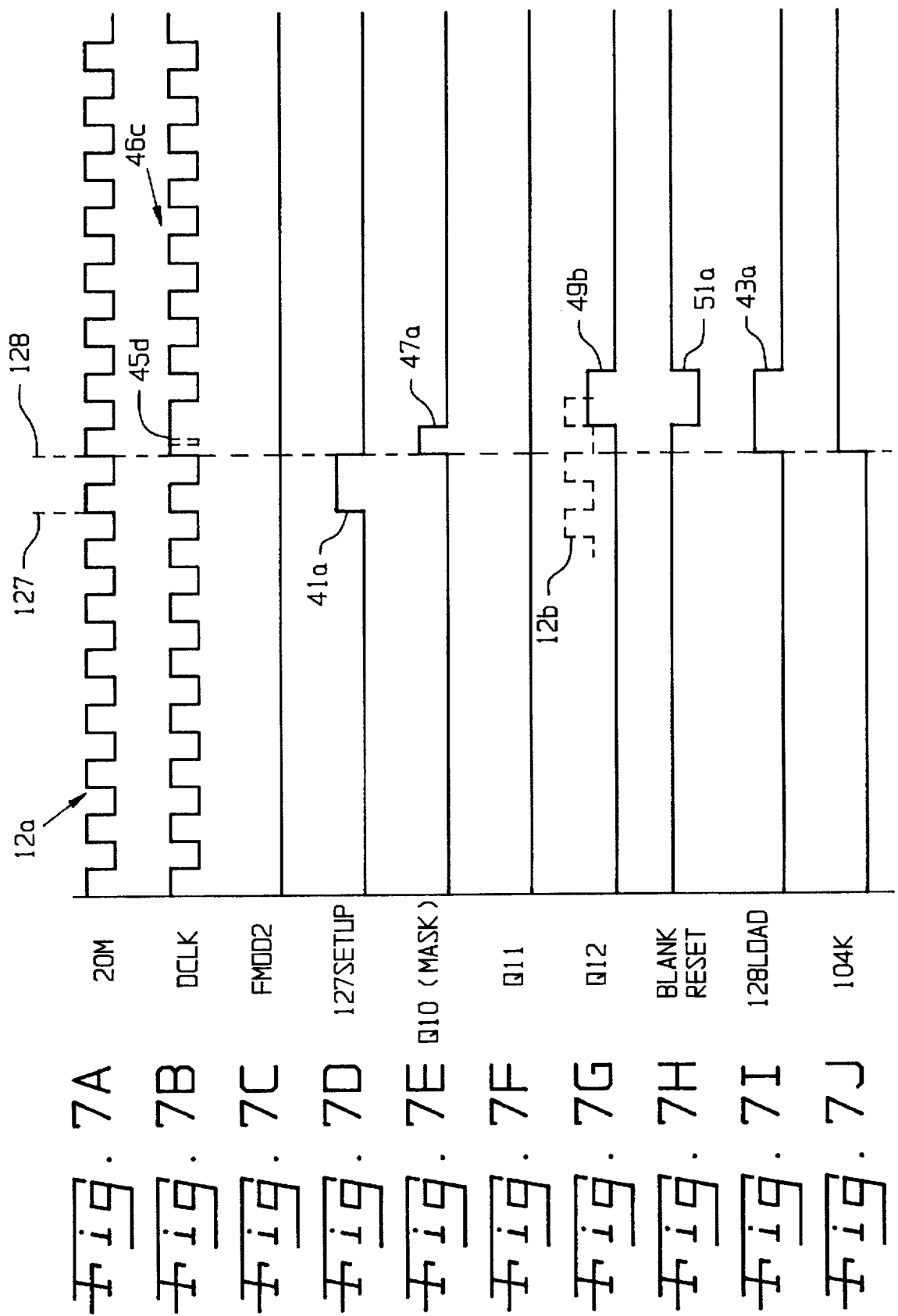

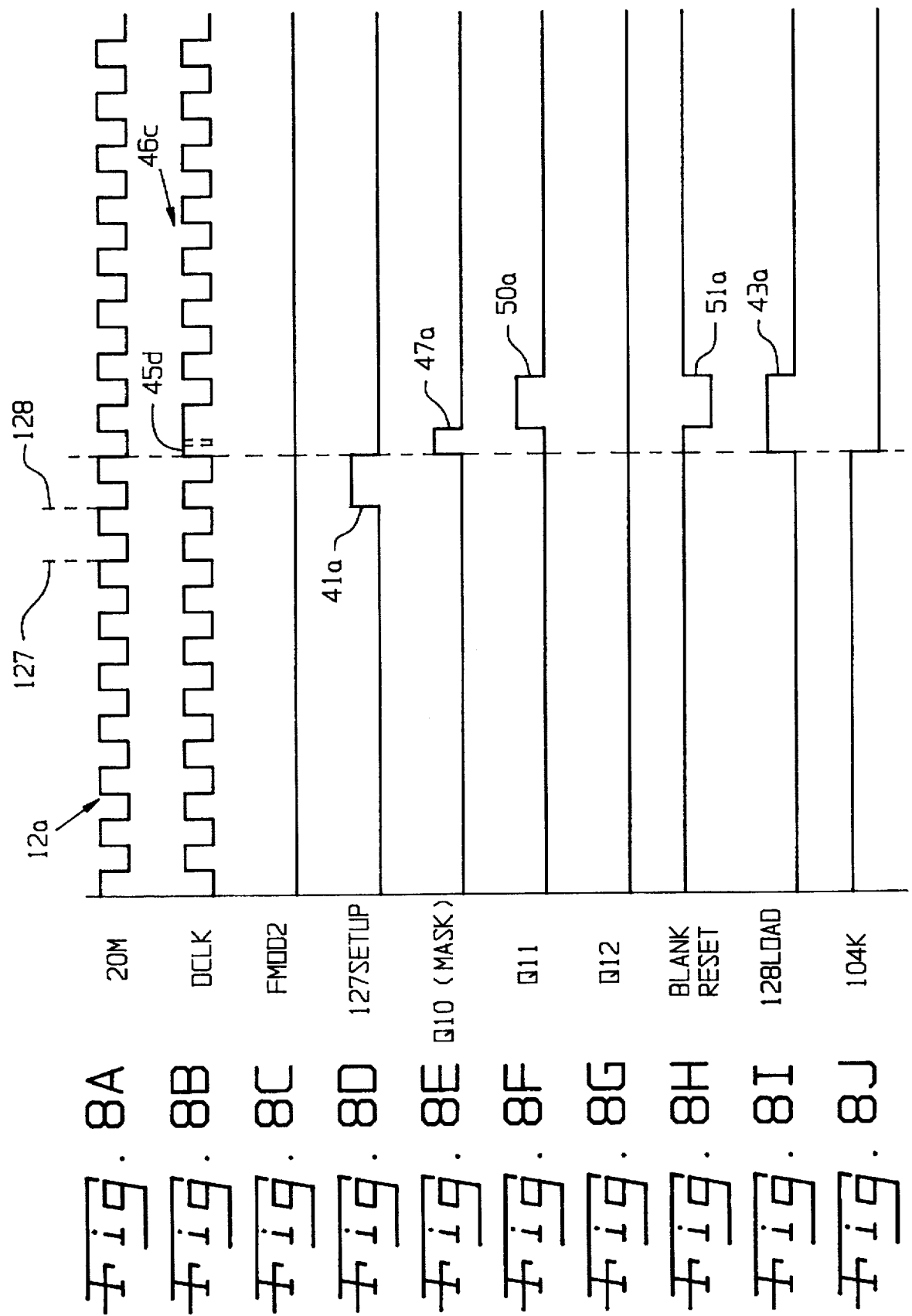

Fmod Low - Load 33, count to 127, Delay to 128, Load 1 count.
= 104.712kHz / (96+1/2) / 8 = 135.637Hz
Fmod Hi - Load 34, count to 127, Delay to 126, Load 1 count.
= 103.627kHz / (95+1/2) / 8 = 135.637Hz

| | | | K VALUE ($d_3/d_2$) | |
|---|---|---|---|---|
| fCLK= | | 20 MHz | 1 | 2 |
| Modulated cntr | $d_1$= | | 4 | 4 |
| | $d_2$= | | 128 | 96 |
| | $d_3$= | | 128 | 192 |
| | $f_1=fCLK/d_1$ | (Hz) | 5000000 | 5000000 |
| | $f_2=fCLK/d_2$ | (Hz) | 156250 | 208333.3 |
| Modulated f | $f_3=fCLK/d_3$ | (Hz) | 156250 | 104166.7 |
| XTAL false lock location | | (+/-Hz @ 10MHz) | 457.23 | 304.82 |
| | | (+/-PPM @ 10MHz) | 45.72 | 30.48 |
| E = +/- 1/2 | $fU=fCLK/(d3-E)$ | (Hz) | 156862.75 | 104438.64 |
| h = 1 | $fL=fCLK/(d3+E)$ | (Hz) | 155642.02 | 103896.10 |
| | synth offset @ uwv | (Hz) | -2.38 | -0.71 |
| | synth offset @ uwv | (df/f) | -3.49E-10 | -1.03E-10 |
| Modulation depth df | | (Hz p-p) | 1220.72 | 542.54 |
| E = +/- 1 | $fU=fCLK/(d3-E)$ | (Hz) | 157480.31 | 104712.04 |
| h = 2 | $fL=fCLK/(d3+E)$ | (Hz) | 155038.76 | 103626.94 |
| | synth offset @ uwv | (Hz) | -9.54 | -2.83 |
| | synth offset @ uwv | (df/f) | -1.40E-09 | -4.13E-10 |
| Modulation depth df | | (Hz p-p) | 2441.56 | 1085.10 |
| E = +/- 1 1/2 | $fU=fCLK/(d3-E)$ | (Hz) | 158102.77 | 104986.88 |
| h = 3 | $fL=fCLK/(d3+E)$ | (Hz) | 154440.15 | 103359.17 |
| | synth offset @ uwv | (Hz) | -21.46 | -6.36 |
| | synth offset @ uwv | (df/f) | -3.14E-09 | -9.30E-10 |
| Modulation depth df | | (Hz p-p) | 3662.61 | 1627.70 |
| E = +/- 2 | $fU=fCLK/(d3-E)$ | (Hz) | 158730.16 | 105263.16 |
| h = 4 | $fL=fCLK/(d3+E)$ | (Hz) | 153846.15 | 103092.78 |
| | synth offset @ uwv | (Hz) | -38.16 | -11.30 |
| | synth offset @ uwv | (df/f) | -5.58E-09 | -1.65E-09 |
| Modulation depth df | | (Hz p-p) | 4884.00 | 2170.37 |
| E = +/- 2 1/2 | $fU=fCLK/(d3-E)$ | (Hz) | 159362.55 | 105540.90 |
| h = 5 | $fL=fCLK/(d3+E)$ | (Hz) | 153256.70 | 102827.76 |
| | synth offset @ uwv | (Hz) | -59.63 | -17.66 |
| | synth offset @ uwv | (df/f) | -8.72E-09 | -2.58E-09 |
| Modulation depth df | | (Hz p-p) | 6105.84 | 2713.13 |

Fig. 11A

| K VALUE (where K is $d_3 / d_2$) | | | | |
|---:|---:|---:|---:|---:|
| 4 | 8 | 16 | 32 | 64 |
| 4 | 4 | 4 | 4 | 4 |
| 80 | 72 | 68 | 66 | 65 |
| 320 | 576 | 1088 | 2112 | 4160 |
| 5000000 | 5000000 | 5000000 | 5000000 | 5000000 |
| 250000 | 277777.8 | 294117.6 | 303030.3 | 307692.3 |
| 62500 | 34722.22 | 18382.35 | 9469.697 | 4807.692 |
| 182.89 | 101.61 | 53.79 | 27.71 | 14.07 |
| 18.29 | 10.16 | 5.38 | 2.77 | 1.41 |
| 62597.81 | 34752.39 | 18390.80 | 9471.94 | 4808.27 |
| 62402.50 | 34692.11 | 18373.91 | 9467.46 | 4807.11 |
| -0.15 | -0.03 | -0.00 | -0.00 | -0.00 |
| -2.23E-11 | -3.83E-12 | -5.68E-13 | -7.77E-14 | -1.02E-14 |
| 195.31 | 60.28 | 16.90 | 4.48 | 1.16 |
| 62695.92 | 34782.61 | 18399.26 | 9474.18 | 4808.85 |
| 62305.30 | 34662.05 | 18365.47 | 9465.22 | 4806.54 |
| -0.61 | -0.10 | -0.02 | -0.00 | -0.00 |
| -8.93E-11 | -1.53E-11 | -2.27E-12 | -3.11E-13 | -4.06E-14 |
| 390.63 | 120.56 | 33.79 | 8.97 | 2.31 |
| 62794.35 | 34812.88 | 18407.73 | 9476.43 | 4809.43 |
| 62208.40 | 34632.03 | 18357.04 | 9462.98 | 4805.96 |
| -1.37 | -0.24 | -0.03 | -0.00 | -0.00 |
| -2.01E-10 | -3.45E-11 | -5.11E-12 | -6.99E-13 | -9.15E-14 |
| 585.95 | 180.85 | 50.69 | 13.45 | 3.47 |
| 62893.08 | 34843.21 | 18416.21 | 9478.67 | 4810.00 |
| 62111.80 | 34602.08 | 18348.62 | 9460.74 | 4805.38 |
| -2.44 | -0.42 | -0.06 | -0.01 | -0.00 |
| -3.57E-10 | -6.13E-11 | -9.09E-12 | -1.24E-12 | -1.63E-13 |
| 781.28 | 241.13 | 67.58 | 17.94 | 4.62 |
| 62992.13 | 34873.58 | 18424.69 | 9480.92 | 4810.58 |
| 62015.50 | 34572.17 | 18340.21 | 9458.50 | 4804.80 |
| -3.81 | -0.65 | -0.10 | -0.01 | -0.00 |
| -5.58E-10 | -9.57E-11 | -1.42E-11 | -1.94E-12 | -2.54E-13 |
| 976.62 | 301.41 | 84.48 | 22.42 | 5.78 |

Fig. 11B

METHODS AND APPARATUS FOR DIGITAL FREQUENCY GENERATION IN ATOMIC FREQUENCY STANDARDS

FIELD OF THE INVENTION

The present invention relates generally to atomic frequency standards, and to methods and apparatus for generating a standard frequency using the hyperfine transition frequency of a class of atoms to maintain a stable standard frequency, and, more particularly, to electronic systems for digitally generating frequency-modulated frequencies for interaction with atoms undergoing hyperfine transition in an atomic frequency standard, and includes methods and apparatus useable in the digital synthesis of frequency-modulated pulse trains.

BACKGROUND ART

Atomic frequency standards generate and maintain a standard frequency output by using the transition between two well-defined energy levels of an atom and the associated precise transition frequency to control the frequency of a frequency generating means. The atomic transition between two energy levels is employed as a highly stable frequency reference to which the frequency of a variable frequency oscillator, such as a voltage controlled oscillator (VCO) can be electronically locked. The high stability and relative insensitivity to environmental perturbations associated with an atomic reference frequency is transferred to the variable frequency oscillator.

Hydrogen, cesium and rubidium frequency standards have been used to provide atomic controlled oscillators in which the generated standard frequency is usually 5 megahertz (MHz) or 10 MHz. Such frequency standards have usually employed a voltage controlled oscillator (frequently a quartz crystal oscillator), a physics package and associated electronics in an effort to maintain an accurate and stable standard frequency on a long-term basis. The physics package and associated electronics have been used to slave the voltage controlled oscillator (VCO) to the frequency of the atomic transition, thereby reducing the drifting due to aging and environmental effects.

As well known in the art, the physics package includes a microwave cavity tuned to the atomic transition frequency, a closed transparent cell of atomic gas in the microwave cavity, an atomic light source to excite atoms of the atomic gas in the cell, means to inject microwave energy developed from the frequency of the voltage controlled oscillator into the microwave cavity of the physics package, and a photodiode to sense the intensity of light from the atomic light source that transits the atomic gas.

In such atomic frequency standards, atoms in the physics package undergo hyperfine transition within a very narrow range of frequencies. For example, the hyperfine transition frequency, frequently referred to as the "atomic resonance frequency", of rubidium (Rb) gas is nominally 6,834,687,500 Hz (6.834 . . . GHz) and a typical physics package has an atomic bandwidth of about 800 to about 2000 Hz. In order to lock the voltage controlled oscillator to the atomic transition frequency with the physics package and to maintain a substantially unvarying standard frequency with the atomic transition frequency, a frequency-modulated microwave interrogation frequency is synthesized from the output frequency of the voltage controlled oscillator and is injected into the microwave cavity of the physics package. The atomic gas within the transparent cell of the physics package is excited by incident light, the intensity of which is sensed by a photo diode to provide a physics package electrical output signal. The energy of the frequency-modulated interrogation frequency injected into the microwave cavity of the physics package interacts with the atomic gas within the physics package and varies the intensity of the light passing through the atomic gas in a manner dependent upon the difference between the injected interrogation frequency and the atomic transition frequency, and the variation in light intensity is detected by the photodiode. The physics package thus provides frequency discrimination with an electrical signal output that can be used to control the frequency of the voltage controlled oscillator.

Thus, frequency modulation of an interrogation carrier frequency, within the atomic bandwidth of the hyperfine transition frequency, is used to determine if the interrogation carrier frequency (which is a function of the standard frequency) is higher or lower than the hyperfine transition frequency to generate a corrective signal to correct the frequency of the voltage controlled oscillator and to lock it to the hyperfine transition frequency.

The standard output frequency of atomic frequency standards is generally either 10 MHz or 5 MHz (although other frequencies can be provided). Since 5 MHz and 10 MHz are not integral sub-multiples of an atomic resonance frequency (e.g. 6.834 . . . GHz for Rb), the generation or synthesization of a frequency-modulated interrogation frequency is not straightforward. Two techniques are commonly used to up-convert a VCO output frequency to the microwave interrogation frequency.

One approach is a direct conversion generating a VCO output frequency at a non-standard value which is an integral sub-multiple of the atomic resonance frequency. In such approaches, the VCO output frequency is converted by a synthesizer to a standard value frequency (e.g., 5 MHz or 10 MHz) if the non-standard output frequency is not acceptable.

A second approach uses a VCO output frequency at a standard value, and multiplier/synthesizer apparatus to convert the output frequency to the atomic resonance frequency for injection into the physics package. Many Rb atomic frequency standards use this approach. A synthesizer is used to generate the non-integer portion of the overall multiplication factor, and a multiplier is used to generate the integer portion of the atomic resonance frequency, and the resulting outputs are mixed and multiplied. Frequency modulation can be accomplished in either the synthesizer or multiplier path of the interrogation frequency generation path. Normally, the synthesizer frequency output level into the multiplier/mixer is significantly lower than the multiplier frequency output level, and, normally, the multiplier frequency is frequency-modulated. The invention provides an improved synthesis of frequencies for this second approach.

Digital synthesis of frequency-modulated interrogation frequencies is known. In one such known digital synthesis, called "binary frequency shift keyed modulation", the interrogation frequency is digitally stepped between two frequencies offset equally, or nearly equally, above and below a desired sub-multiple of one component of the interrogation frequency (such as 5.3125 MHz). Stepping is accomplished at a lower frequency and mixed, for example, with exclusive OR gates, with the standard frequency, such as 5 MHz, to obtain the modulated interrogation frequency. The output of such an exclusive OR mixer includes the spectral components of the first frequency input, plus and minus, the spectral components of the second frequency input, plus and minus the spectral components of any third frequency input.

There are only a limited number of binary number combinations available to divide down digitally from an input clock of, for example, 20 MHz to yield 5 MHz plus only one other mixer input frequency. For example, a 20 MHz clock frequency which generates a stepped frequency about 5.3125 MHz must break down the 5.3125 MHz into at least two frequencies to allow the necessary synthesis. The situation is further complicated by the desire to provide step modulation in the synthesis. A natural breakdown of the desired 5.3125 MHz synthesizer frequency into two frequencies is to select 5 MHz as one input frequency to a mixer and 312.5 kHz as another input frequency, and to split the 312.5 kHz frequency into two inputs to the mixer; however, the digital counter values to provide two such input frequencies to an exclusive OR mixer are too low to provide sufficient resolution to be able to resolve the needed, small, offset frequency differences required for step modulation. For a 20 MHz clock, there is only a single binary number combination giving mixer input frequencies of 5 MHz (20 MHz÷4) and 312.5 kHz (20 MHz÷64). Synthesizer frequency generation for 5.3125 MHz has been accomplished in this way. Unfortunately, such frequency generation results in an unacceptably high modulation depth with step modulations, even if the modulation itself is carried out successfully. For example, if the 312.5 kHz (20 MHz÷64) is incrementally stepped by alternating its division factor 64±1 (e.g., alternating division factors of 63 and 65), the result is a modulation depth of 20 MHz×(1/63−1/65), or 9768 Hz, which is far higher than the desired goal of using no more than approximately the atomic bandwidth, which is typically between 800 Hz to 2000 Hz.

There have been three primary concerns for the selection of input frequencies to the exclusive OR mixers. One is that an integer relationship be preserved between the input frequencies. Otherwise, a multitude of frequency harmonics will be generated that cannot be rejected and will interfere with the unit's proper operation (and possibly give a wrong operating frequency). A second concern is the use of a 50 percent duty cycle for the digital waveforms, both for the modulated signal and the unmodulated signals. Where the duty cycle has been other than 50 percent for the modulation frequency ($f_{mod}$), the unit's full wave demodulator has not been able to properly reject quadrature signals. Where the duty cycle is other than 50 percent for the mixer input frequency waveforms, the synthesizer circuit will generate additional high frequency harmonics that may rob energy from the desired harmonic frequency out of the multiplier mixer. A third concern with the selection of the input frequencies to the exclusive OR mixers is to prevent the generation of "false lock" frequency spurs; that is, harmonic frequency mixing products that lie within the "capture range" of the VCO, which is about twice the adjustment range of the variable frequency oscillator (VCO) plus oversweep of the crystal.

The use of a modulated square wave input signal (@ a frequency f) to an exclusive OR mixer will generate modulated outputs at the odd harmonics of f. These harmonics will show up at the microwave cavity of the physics package due to the mixing and frequency multiplication action of the step recovery diode (SRD) multiplier (generating $I^*f_{MULT} + J^*f_{SYNTH}$ components, where I is a positive integer and J is an integer). Nominally the (J=−1) harmonic of the synthesizer frequency is selected for the atomic standard operation (at 6.834 . . . GHz for rubidium standards). However, the control loop cannot tell which of the modulation frequency harmonics in the microwave system that it is locked onto. The first harmonic frequency of the modulated mixer input from the synthesized output frequency does not generate a lockable signal, and the second harmonic can give a false lock when within the capture range of the VCO. To prevent locking onto one of these false harmonic frequencies, the spur frequencies can be kept greater than the capture range of the VCO, i.e., twice the adjustment range of the VCO plus the over sweep of the crystal; however, this criteria actually can result in an inferior modulation depth, degrading short term stability performance of the atomic frequency standard by as much as 30 percent, depending upon the physics package and variable frequency source in use.

The actual modulation frequencies selected for a unit ideally should provide an optimum modulation depth for the physics package used in the atomic frequency standard, and should satisfy the need to prevent frequency harmonics providing false locking frequencies. The depth of modulation of the interrogation frequency carrier is ideally on the order of the atomic bandwidth for the physics package used.

A method recently used with exclusive OR mixers provides better modulation depth for a given modulation frequency through the use of three synthesizer input frequencies. In a prior art system, 5.3125 MHz was generated using for inputs 5 MHz (or 20 MHz÷4), 208.333 kHz (or 20 MHz÷96), and 104.666 kHz (or 20 MHz÷192), and the ÷192 counter was step modulated. Step modulation with the ÷192 counter substantially reduced the modulation depth.

FIG. 1 illustrates the prior art 3-input frequency synthesizer including 3 divider counters $D_1$, $D_2$, $D_3$ for the input frequency $f_{clock}$ from the VCO, providing, respectively, output frequencies $f_{MIXER}1$, $f_{MIXER}2$ and $f_{MIXER}3$ which are inputs to exclusive OR gates XOR 1 and XOR 2. The frequency outputs of counters $D_2$ and $D_3$, ($f_{MIXER}2$ and $f_{MIXER}3$), are mixed by exclusive OR gate XOR 1, and the mixed frequency output of exclusive OR gate XOR 1 is mixed with the frequency output of counter $D_1$, ($f_{MIXER}1$), by exclusive OR gate XOR 2 to provide a synthesized frequency used to provide an interrogation frequency. FIG. 1 illustrates PATH 1 including divider counters $D_1'$, $D_2'$ and $D_3'$ for generation of the modulation frequency.

FIG. 2 represents the output spectrum of a frequency synthesizer like FIG. 1 and illustrates unwanted synthesizer exclusive OR mixer outputs from input harmonics showing up as spurs, $f_u$, in the output rf signal of the atomic frequency standard.

In implementing digital synthesization of frequency-modulated interrogation signals, the effect of the inherent generation of low frequency harmonics has been minimized by increasing the modulated frequency to shift signals generated by the unwanted low frequency harmonics outside of the capture range of frequency control of VCO, but this approach is not entirely acceptable.

Thus, although digital synthesization of frequency-modulated interrogation frequencies has been implemented in atomic frequency standards, there remains a need to free the frequency-modulated interrogation frequencies from the generation of unwanted low frequency harmonics to provide a 50 percent duty cycle in the synthesized digital waveform of the interrogation frequency and to improve the ability of such atomic frequency standards to be and remain reliably locked to the atomic resonance frequency of such atoms as rubidium and cesium.

SUMMARY OF THE INVENTION

It has been discovered that synchronized synthesis of the plurality of digitally generated frequencies for generation of modulated interrogation frequency can successfully eliminate low frequency harmonics, e.g., below about 25 Hz, that provide unwanted phase noise and lie sufficiently close to the interrogation carrier frequency as to be practically impossible to remove. It has been further discovered that phasing inputs to exclusive OR gate mixers avoids simultaneous "phase flipping" which can otherwise periodically result in output signal cancellation.

In the invention a plurality of digitally generated frequencies for a modulated interrogation frequency output are "synchronously synthesized" by periodically resetting the plurality of frequencies, for example, preferably at the modulation frequency, and/or by using common digital means in generating the plurality of frequencies. In addition, in preferred embodiments, digital frequency inputs to an exclusive OR gate mixer are phased by introducing a brief phase delay, such as a quarter cycle phase delay, in a higher frequency input to the exclusive OR gate.

Further, combination of a frequency synthesizer incorporating these discoveries with a double integration central loop having a low crossover frequency, for example, about 3 Hz to about 5 Hz, results in improved loop stability and phase margin at the crossover frequency, further elimination of high frequency harmonics showing up as spurs, above about 10 kHz, and a frequency spectrum free of spurs except 60 Hz and $f_{MOD}$ harmonics.

The invention provides digital means for synchronously synthesizing, from an output frequency of a controllable frequency source, a plurality of integrally-related sub-multiple frequencies of said source output frequency and an integrally-related modulation frequency, one of said plurality of integrally-related sub-multiple frequencies being frequency-modulated at said integrally-related modulation frequency, and means for digitally mixing said plurality of integrally-related sub-multiple frequencies, including said frequency-modulated sub-multiple frequency, in synthesizing said digital, frequency-modulated interrogation signal.

Synchronous synthesization of the modulated interrogation frequency can be effected in the invention, for example, by resetting means operable at the modulation frequency or a multiple or sub-multiple thereof to simultaneously reset the digital means used in generating at least two of the plurality of integrally-related sub-multiple frequencies for synthesis of the modulated interrogation frequency, and/or by common digital means used for synthesis of at least two of the plurality of integrally-related sub-multiple frequencies used for synthesis of the modulated interrogation frequency, including a frequency-modulated sub-multiple frequency component of the modulated interrogation frequency and an integrally-related modulation frequency.

Also in the invention, a plurality of integrally-related sub-multiple frequencies, preferably at least three frequencies, are selected from a set of integrally-related sub-multiples of a source output frequency, (which is directly related to the standard frequency output of the atomic frequency standard and is frequently referred to as the clock frequency, $f_{CLK}$). In the set of integrally-related sub-multiple frequencies of the source output frequency, the plurality of sub-multiple frequencies, e.g., $f_1$, $f_2$ and $f_3$, are related by division factors $d_1$, $d_2$ and $d_3$, where $d_1 < d_2 \leq d_3$, $d_1$, $d_2$ and $d_3$ are whole numbers, and where $d_2/d_1$, $d_3/d_1$ and $d_3/d_2$ are each powers of the number 2 (including $d_3/d_2=1$, i e., $2^0$) and where a whole number multiple of the sum of plurality of frequencies ($f_1 \pm f_2 \pm f_3$) and a whole number multiple of the source output frequency ($f_{CLK}$) equals the atomic resonance frequency. The modulated sub-multiple frequency comprises two sub-multiple frequencies numerically derived from one of the plurality of integrally-related sub-multiple frequencies, $f_2$ or $f_3$, by incrementing its division factor, $d_2$ or $d_3$, for each half cycle of the modulation frequency. For example, frequency $f_3$ can be frequency-modulated by incrementing its division factor $d_3$ by $h \times \pm \frac{1}{2}$, where h is a whole number, e.g. by $\pm \frac{1}{2}$, or $\pm 1$, or $\pm 1\frac{1}{2}$, or $\pm 2$ or $\pm 2\frac{1}{2}$, etc.

In one preferred embodiment of the invention, the digital interrogation frequency comprises a mixture of three synchronously synthesized, digitally-formatted, integrally-related sub-multiple frequencies of the source output frequency and a digitally-formatted modulation frequency which is itself a sub-multiple of the lowest of the three sub-multiple frequencies of the source output frequency. Two of the digitally-formatted, integrally-related sub-multiple frequencies are synchronously synthesized by resetting their digital generation means at the modulation frequency, and the frequency-modulated sub-multiple frequency and the integrally-related modulation frequency are synchronously synthesized by common digital means used for their synthesis. The frequency modulation depth of the frequency-modulated sub-multiple frequency is on the order of the atomic bandwidth of the atomic resonance frequency. The digitally-formatted, integrally-related sub-multiple frequencies of the source output frequency are preferably "phased" and are mixed by application to exclusive OR gates to synthesize the digitally-formatted, frequency-modulated interrogation frequency.

The invention also comprises a digital half cycle phase delay generator that may be used in atomic frequency standards to numerically increment a division factor for the clock frequency and generate two "integrally-adjacent" sub-multiples of the source output frequency in forming a frequency-modulated, integrally-related sub-multiple frequency, said "integrally-adjacent" sub-multiples being related by division factors generated by (d+E), where E is alternately positive and negative, and being generated during alternating half cycles of the modulation frequency. For example, two "integrally-adjacent" sub-multiple frequencies can be generated (1) by addition of a one-half cycle to the source output, or clock, frequency prior to its division during each cycle of its division, and (2) by dividing the half cycle delayed source output frequency with a preloadable N counter, N being the maximum count value of the counter, that is preloaded with integrally-adjacent numbers, such as a number M and a number M+1 or M−1 during alternating half cycles of the modulation frequency, thereby effecting fractional division factors and, if desirable, (3) by further dividing by two the resultant half cycle incremented but divided frequencies. In addition to providing fractional division factors, the digital half cycle phase delay generator permits frequency modulation with increased options of modulation depth and index, and permits the generation of odd division factors and frequency modulation with a 50 percent duty cycle. The digital half cycle delay generator is also useful in other applications where it may effect, with a digital counter, a fractional dividing factor.

In the invention, a modulation frequency with a 50 percent duty cycle can be synthesized from the two "integrally-adjacent" sub-multiple frequencies by further dividing each of the "integrally-adjacent" sub-multiple frequencies, during the modulation frequency half cycle of its generation, by the division factor used in synthesizing the other of the "integrally-adjacent" sub-multiple frequencies; however, where the frequency difference between the "integrally-adjacent" sub-multiple frequencies is small enough, the "integrally-adjacent" sub-multiple frequencies can be further divided by a large division factor, that is, with a high count counter, to provide a modulation frequency with a departure from a 50 percent duty cycle so slight as to not unacceptably affect the means for controlling the controllable frequency source.

The invention includes a method and apparatus for synthesizing a lower frequency output pulse train from a higher frequency input pulse train by digitally delaying the higher frequency input pulse train by one-half cycle at each phase reversal of the lower frequency output pulse train to provide a one-half cycle delayed higher frequency input pulse train and thereafter dividing the half cycle delayed higher input frequency pulse train to provide said lower frequency output pulse train.

In the invention, the means for digitally delaying the higher frequency input pulse train by one-half cycle includes an exclusive OR gate with one input as the higher frequency input pulse train and another input as the lower frequency output pulse train to thereby delay a transition of the higher frequency input pulse train by one-half cycle at the beginning of each half cycle of the lower frequency output pulse train. Transients during the half cycle delay that may result from circuit operating delays can be eliminated by generating a masking pulse at the beginning of each half cycle of the lower frequency output pulse train and applying the masking pulse and the half cycle delayed higher frequency pulse train to an OR gate, the output of the OR gate being divided in generation of said lower frequency output pulse train, thereby providing a fractional division factor. The division of the half cycle delayed higher frequency input pulse train can be accomplished by a preloadable N counter to provide an output frequency of f/(N+½), and the division factor of the preloadable N counter can be varied by presetting the counter with a number M to provide an output frequency of [(f/(N−M+½)].

The output frequency of the N counter can be frequency-modulated by presetting the counter with different numbers, M and X, during alternating half cycles of the lower frequency pulse train. For example, by presetting the N counter with the number M during the "low" half cycles of the lower frequency pulse train and with the number M+1 (i.e., X=M+1) during the "high" half cycles of the lower frequency pulse train, the output of the N counter can be frequency-modulated between frequencies of [f/(N−M +½)] and [(f/(N−M−½)] can provide "integrally-adjacent" sub-multiple frequencies for use in synthesizing a frequency-modulated interrogation frequency for the physics package of an atomic frequency standard. A modulation frequency with a 50 percent duty cycle can be generated by additional dividers from the "integrally-adjacent" frequencies as set forth above.

Other features and advantages of the invention will be apparent to those skilled in the art from the following detailed description and the attached drawings.

DETAILED DESCRIPTION OF THE DRAWINGS

FIG. 7 illustrates time-related series of pulses 7A–7J demonstrating the operation of a digital half cycle phase delay generator of the invention at the beginning of each counting cycle of the counters $Q_1$–$Q_7$ of FIG. 6;

FIG. 8 illustrates time-related series of pulses 8A–8J, corresponding to the time-related series of pulses 7A–7J of FIG. 7, and demonstrating the operation of the digital half cycle phase delay generator at the end of each counting cycle of counters $Q_1$–$Q_7$;

FIG. 11, which comprises the combination of FIGS. 11A and 11B, presents criteria of the invention for selection of division factors, clock frequencies and sub-multiples of clock frequencies for use in synthesizing a frequency-modulated interrogation signal for an atomic frequency standard.

DETAILED DESCRIPTION OF THE BEST MODE OF THE INVENTION

Figure 3:
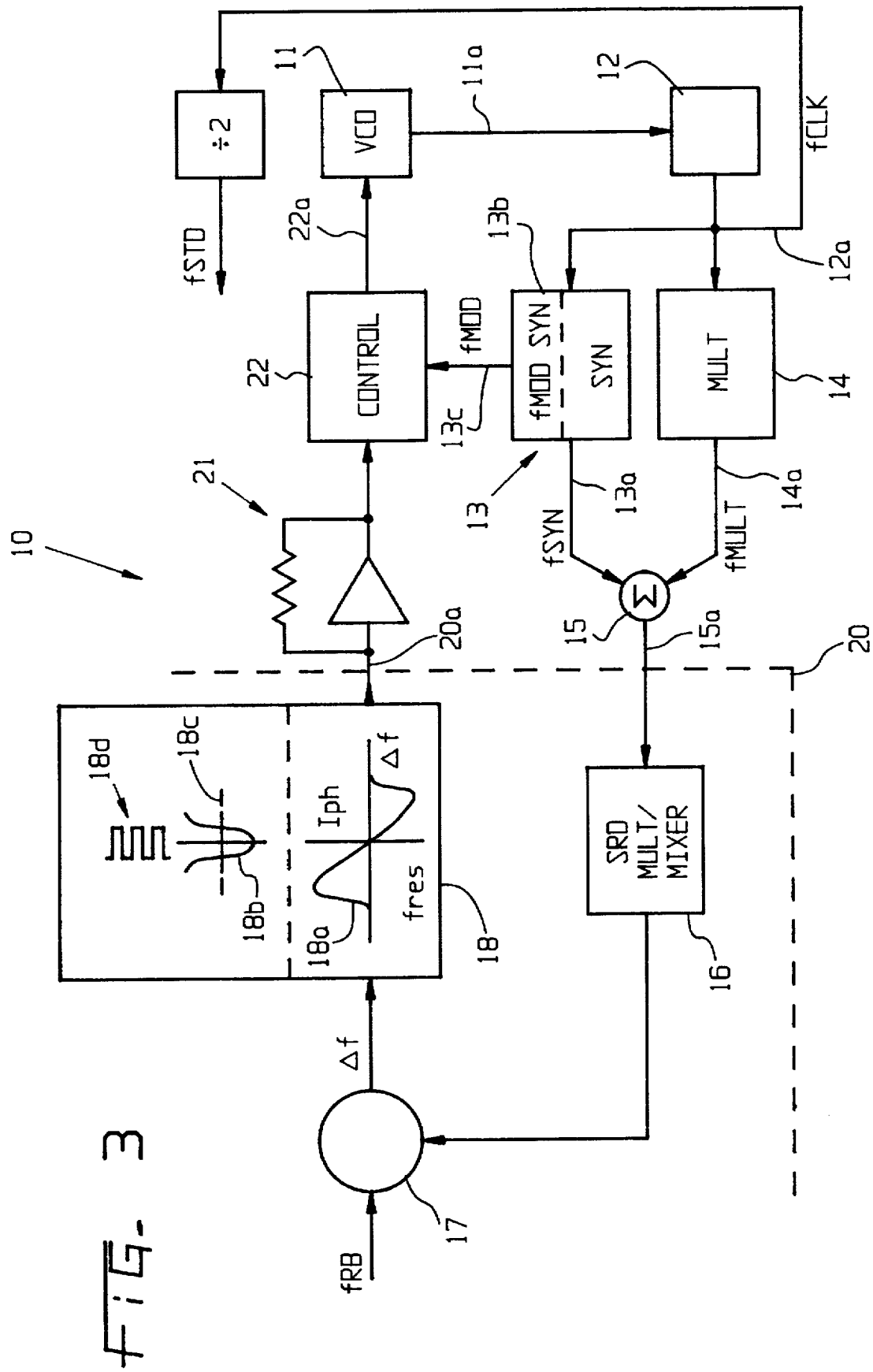
FIG. 3 is a simplified block diagram of one atomic frequency standard in which invention can be used.

FIG. 3 is a simplified block diagram of an atomic frequency standard 10 in which the invention can be incorporated. Such an atomic frequency standard includes a controllable frequency source 11, such as a voltage controlled oscillator (VCO), or voltage control crystal oscillator (VCXO), for generating a standard frequency such as 10 MHz, but in this described preferred embodiment the controllable frequency source generates a source output, or clock, frequency of 20 MHz which is divided by two to provide a "standard" 10 MHz frequency output. The frequency generated by the controllable frequency source 11 is, as well known in the art, locked to the atomic transition frequency of an atomic gas such as rubidium gas which has an atomic transition frequency of 6.834 . . . GHz.

In the operation of the atomic frequency standard 10 the output 11a of the controllable frequency source 11 is connected with means 12 for forming output 11a into a digital pulse train 12a with pulses at 20 MHz. The pulse train 12a is applied to a frequency synthesizer 13 of the invention and a multiplier 14. The output of the frequency synthesizer 13a is, preferably, for a rubidium standard, 5.3125 MHz which is generated and frequency-modulated digitally as described below in greater detail. The output of the controlled frequency source 11 is multiplied in multiplier 14 in a manner well known in the art (for example, by a whole number Z to provide $Z \times f_{CLOCK}$). The output 14a of the multiplier is summed with the output 13a of the digital frequency synthesizer 13 in a summing circuit 15. As known in the art, matching circuits (not shown) may be used between the outputs of the frequency synthesizer 13 and the multiplier 14 and summing circuit 15. The output 15a of the summing circuit is connected with an SRD multiplier/mixer 16 in a physics package 20. The output of SRD multiplier/mixer is injected into the microwave cavity, diagrammatically shown as 17 and 18, of the physics package 20 where it interacts with the atoms of an excited atomic gas. Where the atomic gas is rubidium, the output of SRD multiplier mixer 16 is a digitally-formatted, frequency-modulated, interrogation frequency of 6.834 . . . GHz which is the atomic transition frequency (atomic resonance frequency) of rubidium when the output of the controllable frequency source 11 is at the standard frequency.

The physics package 20 acts as a phase discriminator, or phase detector, diagrammatically shown in 17 and 18 of FIG. 3, and produces a photodiode electrical output signal which is a function of the difference between the microwave interrogation signal and the atomic transition frequency of the atomic gas. The relationship of the photodiode signal output amplitude and phase to frequency difference is illustrated as 18a. The derivation of the signal output amplitude to frequency difference is illustrated as 18b. The 18a and 18b illustrations are exaggerated for purposes of illustration and explanation and are not to any scale.

If the interrogation frequency is, for example, less than the atomic transition frequency of the atomic gas, the photo diode of the physics package will provide an electrical output signal at the modulation frequency having one phase. If, however, the interrogation frequency is greater than the atomic transition frequency of the atomic gas, the photo detector of the physics package will provide an electrical signal at the modulation frequency which is 180° out of phase with its output frequency when the interrogation frequency is less than the atomic transition frequency. When the interrogation frequency is equal to the atomic resonance frequency, the photo diode provides an output signal at twice the modulation frequency.

As illustrated by 18b, the physics package has an output signal amplitude characteristic centered on the atomic resonance frequency ($f_{res}$) with an atomic bandwidth that is very narrow, for example, about 800 to about 2000 Hz. In some practical physics packages of commercial rubidium atomic frequency standards the output signal amplitude characteristic 18b has a maximum slope and therefore provides a maximum change in the output signal for changing frequency at about ±400 Hz from the atomic resonance frequency (indicated by line 18c). In such standards, frequency modulation depths (indicated by 18d) of about 600 Hz to 1200 Hz and preferably about 800 Hz can change the signal output by as much as 30 percent. The synthesis of frequency-modulated interrogation signals with such optimal modulation depths can, however, provide false lock possibilities.

Thus, the output of physics package 20 provides different signals when the interrogation frequency is below, above and at the atomic resonance frequency, which are used to adjust the controllable frequency source 11 and lock it to the atomic transition frequency of the atomic gas.

As shown in FIG. 3, the photodetector current output signal 20a of the physics package 20 is converted to a voltage in a pre-amp 21 and the voltage output is connected with a servo control circuit 22 which demodulates the electrical signal and develops a control signal 22a for the controllable frequency source 11 which adjusts the frequency of the controllable frequency source 11 toward the atomic transition frequency when the atomic frequency standard 10 is first turned on and thereafter maintains the frequency of the controllable frequency source 11 at the standard frequency, or a multiple or sub-multiple of the standard frequency, during its operation.

The digital frequency synthesizer 13 comprises a digital means 13b for generating a digitally-formatted modulation frequency which is used in the digital synthesizer 13 to synthesize a digitally-formatted, frequency-modulated interrogation signal. The digitally-formatted modulation frequency 13c is also connected with servo control circuit 22 for demodulation of the amplified electrical signal output of physics package 20.

Throughout the description of the invention and its references to various frequencies, it should be understood that we are referring to a series of digital pulses occurring at a rate equal to the frequency, each frequency cycle of said digital pulse train being characterized by a "high" state followed by a "low" state (i.e., a "1" and a "0").

Figure 4:
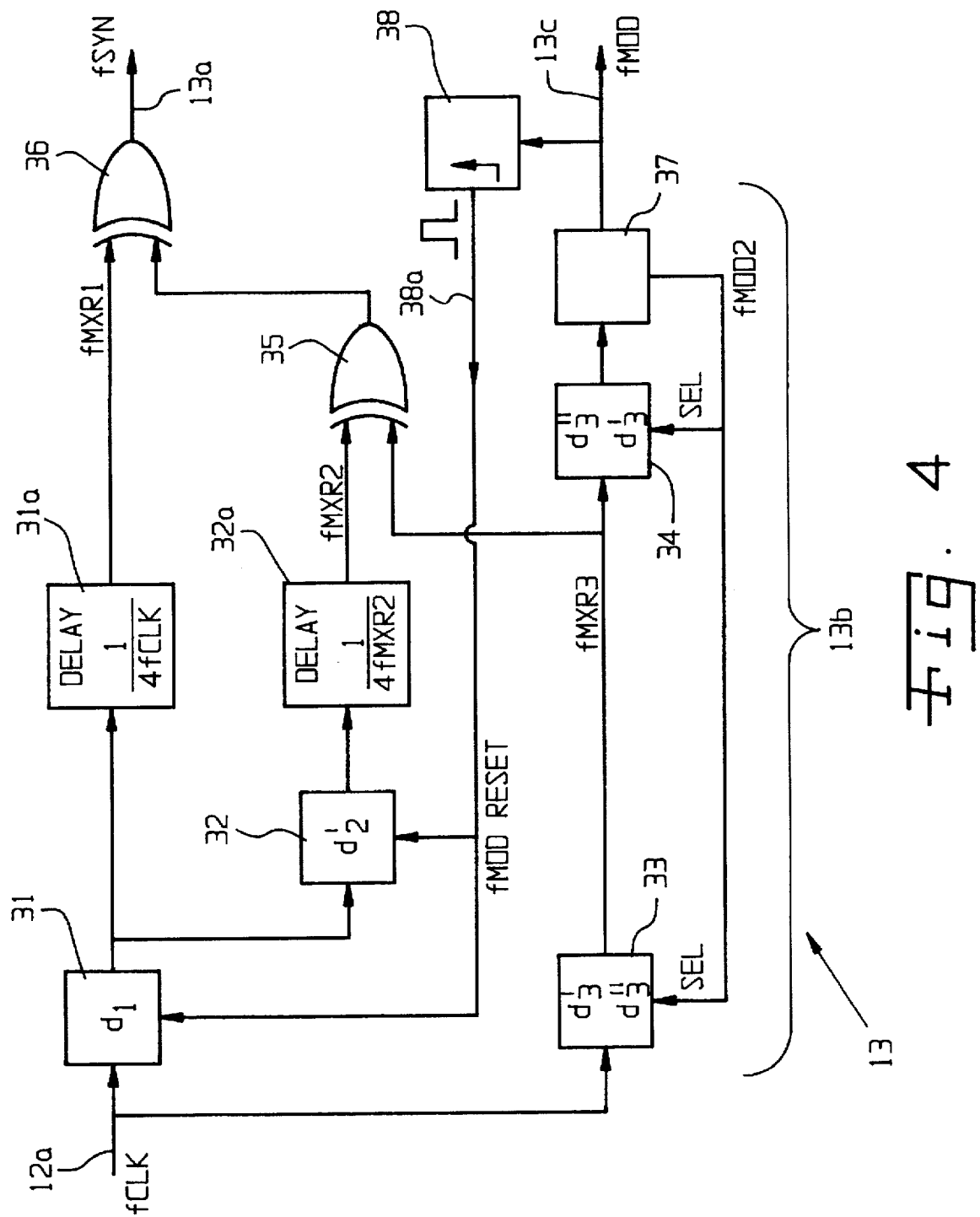
FIG. 4 is a simple block diagram schematic of a preferred frequency synthesizer of the invention for generating a digitally-formatted, frequency-modulated, interrogation frequency with a 50 percent duty cycle.
Figure 4A:
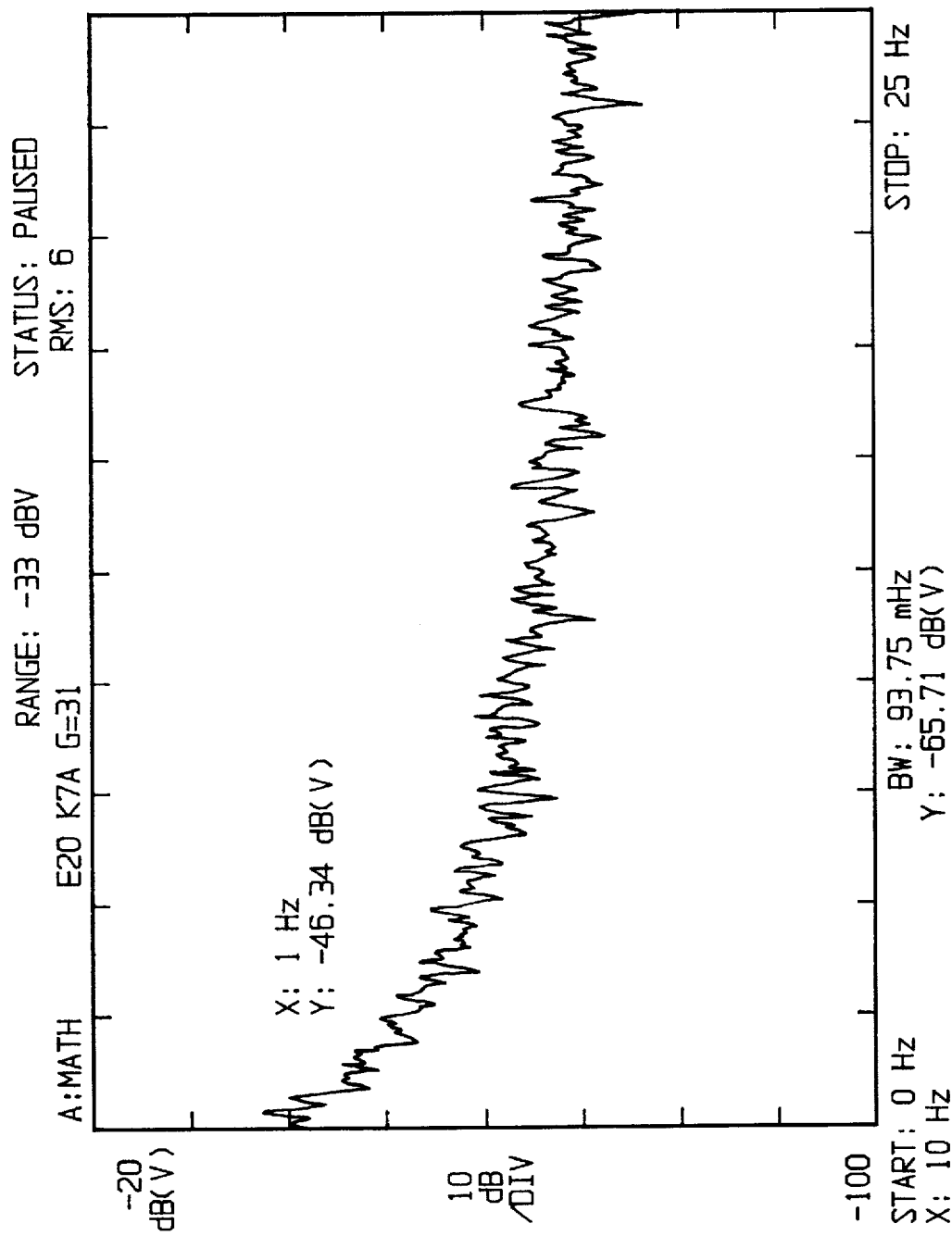
FIG. 4A is a chart corresponding to the chart of FIG. 2 illustrating the improvement in the output of an atomic frequency standard with the embodiment of FIG. 4.

FIG. 4 is a simple block diagram of a preferred digital frequency synthesizer 13 of this invention. For convenience, the operation of digital frequency synthesizer 13 will be described using 20 MHz as the source output, or clock, frequency of controllable frequency source 11, although the invention may be used with other frequencies.

As shown in FIG. 4, preferred digital synthesizer 13 includes four divider counters 31, 32, 33 and 34, two exclusive OR circuits 35 and 36, two delay circuits 31a and 32a, a reset circuit 38 and an optional further divider 37. Divider counter 31 divides the frequency $f_{CLK}$ by a division factor $d_1$ to provide an output frequency $f_{MXR1}$, which is phased with a delay 31a equal to a quarter cycle (i.e. 90°) of the clock frequency $f_{CLK}$ and applied to an input of exclusive OR gate 36. Divider counter 32 further divides the frequency $f_{MXR1}$ by a further division factor $d_2'$. The division factor $d_1$ of the common digital means 31 and the division factor $d_2'$ combine to provide a division factor $d_2$ and an output frequency $f_{MXR2}$ which is phased with a delay 32a equal to a quarter cycle (i.e. 90°) of the frequency $f_{MXR2}$ and applied to an input of exclusive OR gate 35. As set forth more fully below, divider counter 33 divides, in alternate half cycles of the modulation frequency, the frequency $f_{CLK}$ by a pair of division factors $d_3'$ and $d_3''$ to provide a frequency-modulated output $f_{MXR3}$ which comprises two "integrally-adjacent" frequencies which alternate above and below a center frequency, which is the frequency $f_{CLK}$ divided by a division factor $d_3$. As shown in FIG. 4, the modulated frequency $f_{MXR3}$ is applied to another input of exclusive OR gate 35, with the output of exclusive OR gate 35 applied to another input of exclusive OR gate 36. Proper phasing (timing) of the inputs to exclusive OR gates 35 and 36 avoids simultaneous "phase flipping" transitions by the exclusive OR gates 35 and 36 and a resulting disturbance in the $f_{SYN}$ pulse train which can result in a reduction of the effective amplitude in the output signal from the frequency synthesizer 13 and the generation of unwanted low frequency modulation of the frequency synthesizer output signal.

As shown in FIG. 4, the digital means, counters 31 and 32, that generate the two frequencies, $f_{MXR1}$ and $f_{MXR2}$, are reset at a frequency equal to the modulation frequency and are thus synchronized with the $f_{CLK}$ input every $1/f_{MOD}$ seconds. Frequency synthesizer 13 includes resetting means 38 which comprises a reset pulse generator for generation of a reset pulse 38a, which is applied to reset counters 31 and 32 each cycle of the modulation frequency. By resetting the digital means 31 and 32 at least once every cycle of the modulation frequency, frequencies $f_{MXR1}$ and $f_{MXR2}$ are synchronously synthesized, and unwanted low frequency harmonics, showing up as spurs in the frequency spectrum, can be successfully eliminated. Such low frequency spurs, (for example, at frequencies less than 25 Hz and sometimes lower than 5 Hz) in the $f_{SYN}$ output are too close to the interrogation carrier frequency to permit removal by filtering with practical filtering means because of the extremely high Q required for an effective filter.

Thus, in the invention, at least two of the plurality of the integrally-related sub-multiple frequencies are synchronously synthesized and periodically reset to obtain and maintain a phase relationship that avoids the generation of low frequency harmonics, which may arise from small time differences in operation of different digital means. In the described embodiments, the digital means by which at least two of the plurality of integrally-related sub-multiple frequencies are preferably reset by resetting means 38 operating at the modulation frequency; however, the periodic resetting can be effected at multiples and at sub-multiples of the modulation frequency.

A frequency synthesizer 13 of FIG. 4 provides a substantially improved synthesized frequency output and frequency-modulated interrogation signal input to the physics package, and reliable locking of a controllable frequency source (VCO) to the atomic resonance frequency in atomic frequency standards with a single control loop integrator having, for example, a crossover frequency at about 30 Hz to about 50 Hz. In the preferred frequency synthesizer 13 of FIG. 4, the $f_{SYN}$ and $f_{MOD}$ output frequencies are synchronously synthesized through the combined use of the common digital means 31 and 33 used in their synthesis and the resetting of the digital means 31 and 32, and the frequency component inputs, $f_{MXR1}$, $f_{MXR2}$ and $f_{MXR3}$, to the exclusive OR gates 35 and 36 are properly phased; however, a substantial improvement over prior art frequency synthesizers may be achieved with frequency synthesizers including only one or more of these improvements.

Further improved operation of atomic frequency standards can be achieved with the combination of a frequency synthesizer of FIG. 4 with a control loop double integrator in control 22 (FIG. 3) having, for example, a low crossover frequency of about 3 Hz to about 5 Hz. As noted above, resetting the digital means by which the frequencies $f_{MXR}$ and $f_{MXR}2$ are synthesized substantially eliminates the low frequency harmonics, e.g., below about 25 Hz, which are practically impossible to remove with presently available filtering means, but at the potential expense of high frequency harmonics, generally above about 10 kHz, which can be effectively removed by presently available filtering. Combining the frequency synthesizer 13 of FIG. 4 with a control loop double integrator having a crossover frequency of about 3 Hz to about 5 Hz, however, still further improves the control loop stability and phase margin at the crossover frequency and reduces the unwanted high frequency harmonics over about 10 kHz below the noise floor of the atomic frequency standard, with a resulting frequency spectrum free of spurs except for the 60 Hz and $f_{MOD}$ harmonics.

The actual crossover frequency is a tradeoff between the physics package and VCO noise performance (affecting the unit phase noise and short term stability performance), the loop stability, the filtering into the VCO (affecting the unit harmonic spur performance), and available component values.

Another feature of the preferred frequency synthesizer 13 of FIG. 4 lies in its ability to provide a modulation frequency $f_{MOD}$ and frequency-modulated output $f_{SYN}$ with a 50 percent duty cycle. Counters 33 and 34 are operated synchronously by an $f_{MOD}2$ output of counter 37 to divide their input frequencies by division factors $d_3'$ and $d_3''$ in alternate half cycles of the $f_{MOD}$ frequency, counter 33 dividing its input frequency by the factor $d_3'$ in the same $f_{MOD}$ half cycle as counter 34 is dividing its input frequency (the output of counter 33) by the dividing factor $d_3''$, and changing on the next $f_{MOD}$ frequency half cycle so counter 33 is dividing its input by the division factor $d_3''$ at the same time that counter 34 is dividing its input (the counter 33 output) by the division factor $d_3'$.

In the invention, the division factors of the divider counters 31, 32, 33 and 34 and the optional divider counter 37 are preferably selected, as set forth below. Frequency synthesizer 13 can, for example, operate to provide an output frequency $f_{SYN}$, that is 5.3125 MHz, frequency-modulated over 1085 Hz at 135.637 Hz. In such an embodiment, counter 31 is selected to divide the 20 MHz input signal by a division factor $d_1$ equal to a division factor 4 providing an output signal $f_{MIXER}1$ equal to 5 MHz, and counter 32 is selected to divide the 5 MHz input signal by a further division factor $d_a$ of 24 to effect a total division factor $d_2$ of 96 to provide an output signal of $f_{MIXER}2$ of 208.3 kHz.

As indicated above, counter circuit 33 (FIG. 9A) and counter circuit 34 (FIG. 9B) are more complex in their operation than the divider counters 31 and 32 and provide "integrally-adjacent" sub-multiple frequencies of the clock frequency 20 MHz. That is, counter circuits 33 and 34 generate, during alternate half cycles of the modulation frequency, integrally-adjacent sub-multiples of the input frequency 12a so that $d_3'$ and $d_3''$ are related by the relationship $d_3+E$ (e.g., where $E=\pm 1$, $d_3=192$, $d_3'=191$ and $d_3''=193$). Counter 33 provides a frequency- modulated, integrally-related lowest sub-multiple of the input frequency $f_{MIXER}3$ which is combined with the higher and intermediate sub-multiples of the input frequency, $f_{MIXER}1$ and $f_{MIXER}2$, respectively in generation of an interrogation signal component $f_{SYN}$, and, with counter 34, provides the modulation frequency $f_{MOD}$. The operation of counter circuits 33 and 34 to generate such integrally-adjacent sub-multiples of the source output, or clock, frequency 12a of the controllable frequency source 11 is described in greater detail below in the discussion of FIG. 6.

In the FIG. 4 embodiment, the output of counter 31 is the highest sub-multiple of the output frequency of the controllable frequency source 11, the output of counter 32 is an intermediate sub-multiple frequency, and the output of counter 33, which varies on alternate half cycles of the modulation frequency to provide "integrally-adjacent" sub-multiple frequencies, is the frequency-modulated lowest sub-multiple frequency.

Through their operation, described below, counter circuits 33 and 34 in this exemplary embodiment operate during alternate half cycles of the modulation frequency (e.g., during "high" or "1" times of the modulation frequency pulse train) to divide the 20 MHz by factors of 191 (counter circuit 33) and 193 (counter circuit 34) and during the other alternate half cycles of the modulation frequency (i.e., during "low" "0" times of the modulation frequency pulse train) to divide the 20 MHz by factors of 193 (counter circuit 33) and 191 (counter circuit 34), thereby providing a digitally-formatted output frequency with a 50 percent duty cycle.

Counter 37 has a division factor of 4 in this example and its output comprises a modulation frequency $f_{MOD}$ and an $f_{MOD}2$ signal which is used, as indicated in FIG. 4, to switch between the "integrally-adjacent" sub-multiple frequencies by setting counter circuit 33 to have a division factor of 191 and a division factor of 193 on alternate half cycles of the modulation frequency. The $f_{MOD}2$ signal is also applied to counter circuit 34 to synchronize its switching between division factors of 193 and 191 so counter circuit 34 is dividing with a division factor 193 while counter circuit 33 is dividing a division factor 191, and vice versa, to provide the digitally-formatted modulation frequency with a 50 percent duty cycle. The output frequency $f_{MIXER}3$ is therefore 104.712 kHz (20 MHz÷191) during one set of half cycles of the modulation frequency and 103.627 kHz (20 MHz÷193) during the other set of half cycles of the modulation frequency, and $f_{MIXER}3$ alternates between 104.712 kHz and 103.626 kHz at 135.637 Hz (20 MHz/(191×193×4)).

As noted above, modulation frequency output 13c of counter 37 is connected with the servo control circuit 22 for demodulation of the electrical signal output of physics package 20, as shown in FIG. 3.

Figure 5:
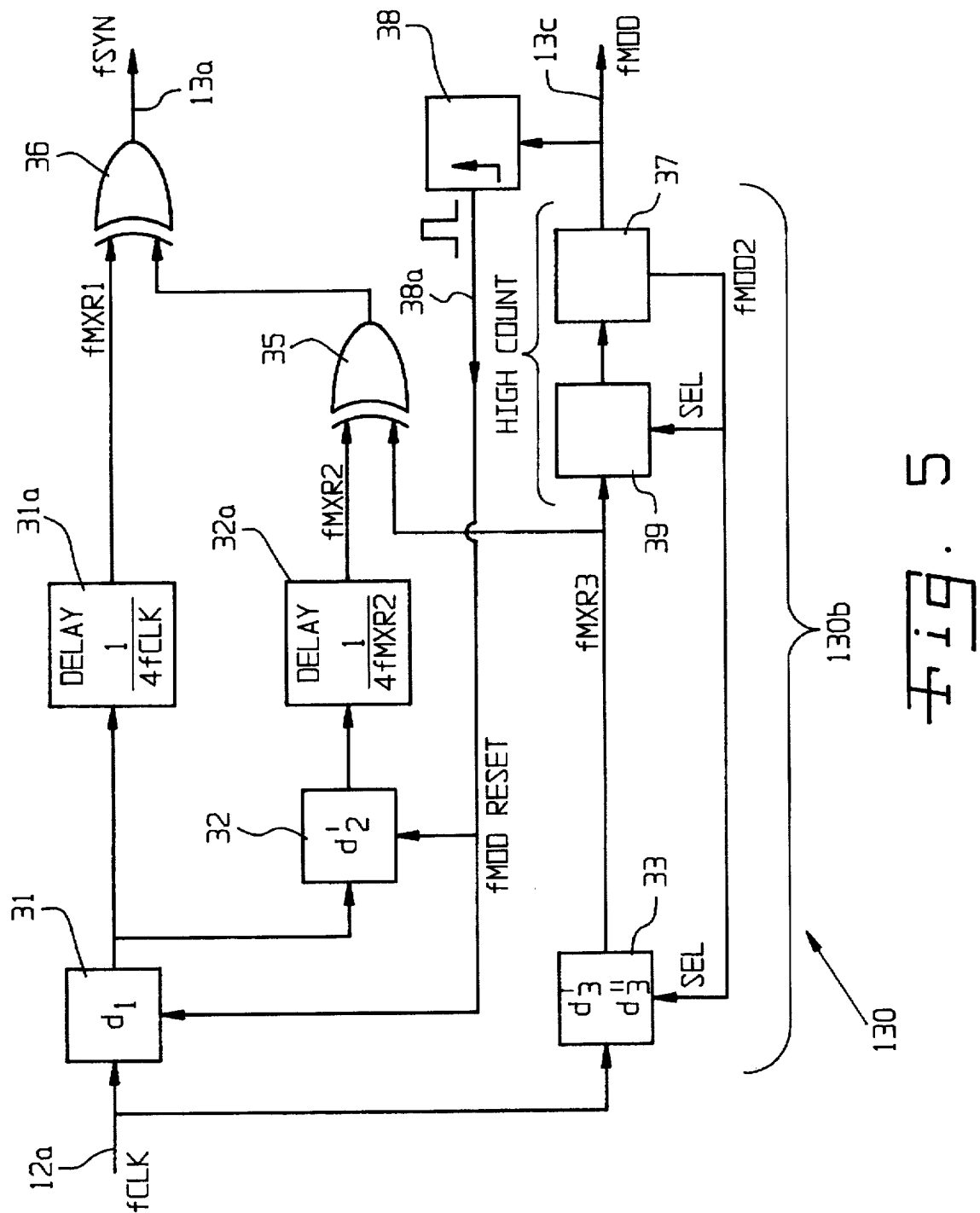
FIG. 5 is a simple block diagram schematic of another frequency synthesizer of the invention for generating a digitally-formatted, frequency-modulated interrogation frequency with an acceptable duty cycle other than 50 percent.

FIG. 5 is a schematic block diagram of a frequency synthesizer 130 of the invention, which provides a digitally-formatted modulation frequency with an acceptable duty cycle other than 50 percent. As indicated by a comparison of FIGS. 4 and 5, the frequency synthesizer 130 of FIG. 5 generally differs from the frequency synthesizer 13 of FIG. 4 only through the use of a non-varied divider counter 39, with a high division factor, rather than the more complex synchronized counter circuit 34 of FIG. 4. The modulation frequency output of the frequency synthesizer 40 thus does not have a 50 percent duty cycle, but where the division factors for counters 31, 32 and 33 are selected to provide the same division factors as in FIG. 4, that is, $d_1=4$, $d_2=96$ (which is the same as dividing by 4 and then 24, i.e., $d_1 \times d_a$), and $d_3$ comprises 191 and 193 on alternating half cycles of the modulation frequency, and counter 39 is a high count counter providing a very large division factor $d_m$, like 192, the departure of the duty cycle from a 50 percent duty cycle is sufficiently small to provide acceptable use in an atomic frequency standard.

In both the embodiment of FIG. 4 and the embodiment of FIG. 5 the modulation frequency $f_{MOD}$ and the frequency-modulated sub-multiple frequency $f_{MIXER}3$ are synchronously synthesized by use of common and reset digital means. In the FIG. 4 embodiment, because of its 50 percent duty cycle; that is, because of the equal times of the half cycles of the modulation frequency, the output of divider 33 includes more cycles of the 104.712 kHz in one set of half cycles than there are cycles of the 103.627 kHz in the other set of half cycles. In the FIG. 5 embodiment, however, the nominal 104 kHz output of divider 33 is further synchronized with the 208 kHz output of divider 32 at every 192nd pulse of the output of divider 33 because of the difference in duty cycle of the modulation frequency, that is, there are the same number of 104.712 kHz cycles in one set of half cycles of the modulation frequency as there are 103.627 kHz cycles in the other set of half cycles of the modulation frequency.

Figure 1:
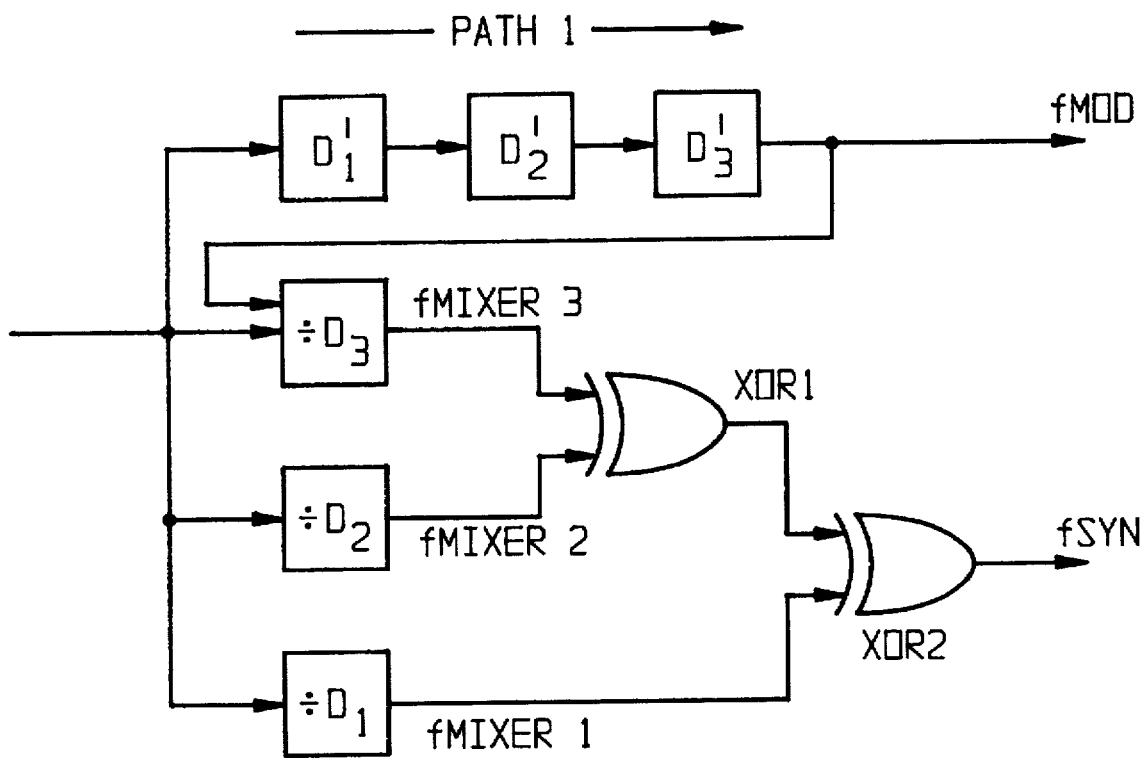
FIG. 1 is a block diagram schematic of a prior art, three input frequency synthesizer.
Figure 2:
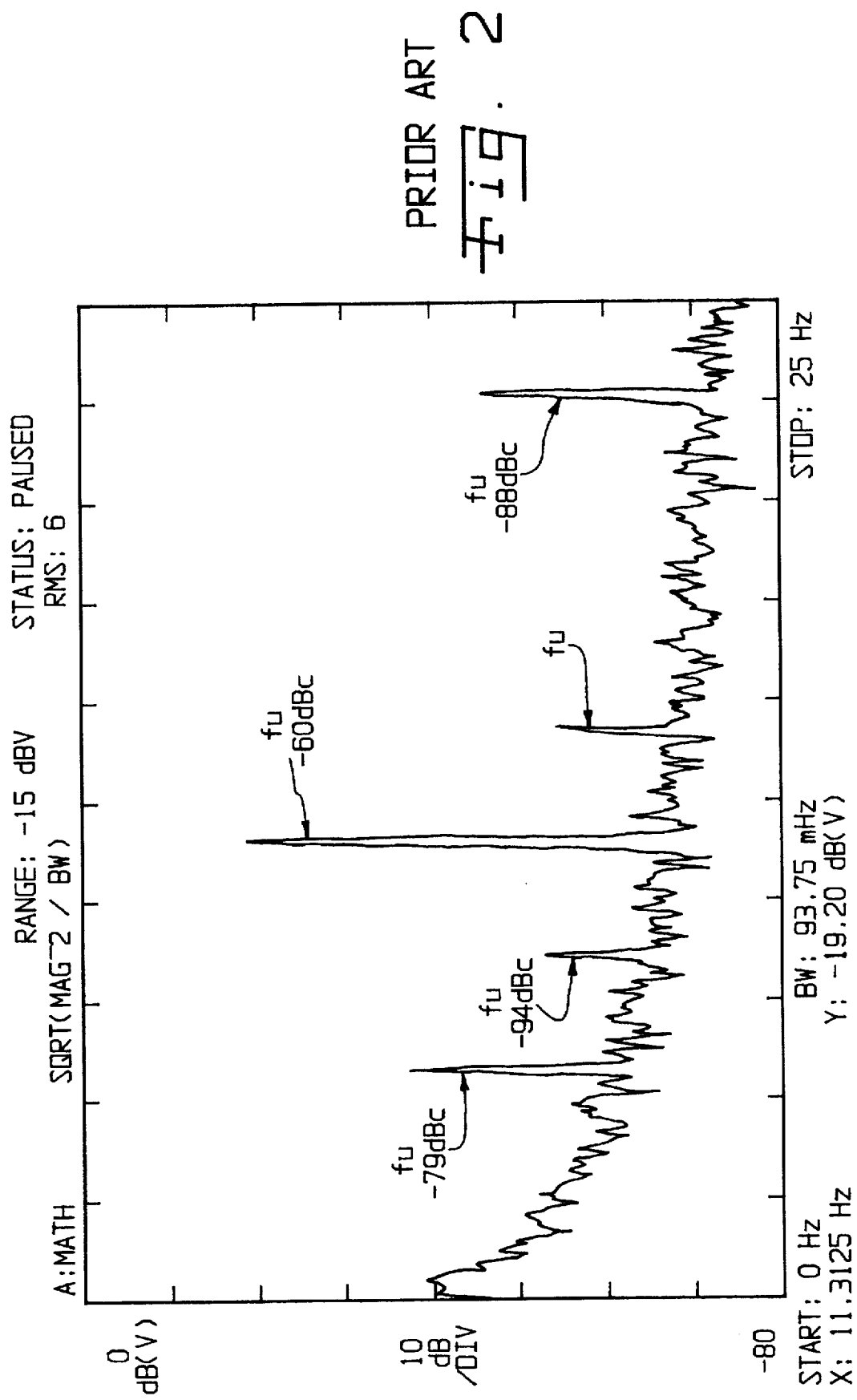
FIG. 2 is a chart illustrating the unwanted low frequency harmonics as seen in the rf output of an atomic frequency standard which appear as spurs in the output of the prior art frequency synthesizer of FIG. 1.
Figure 5A:
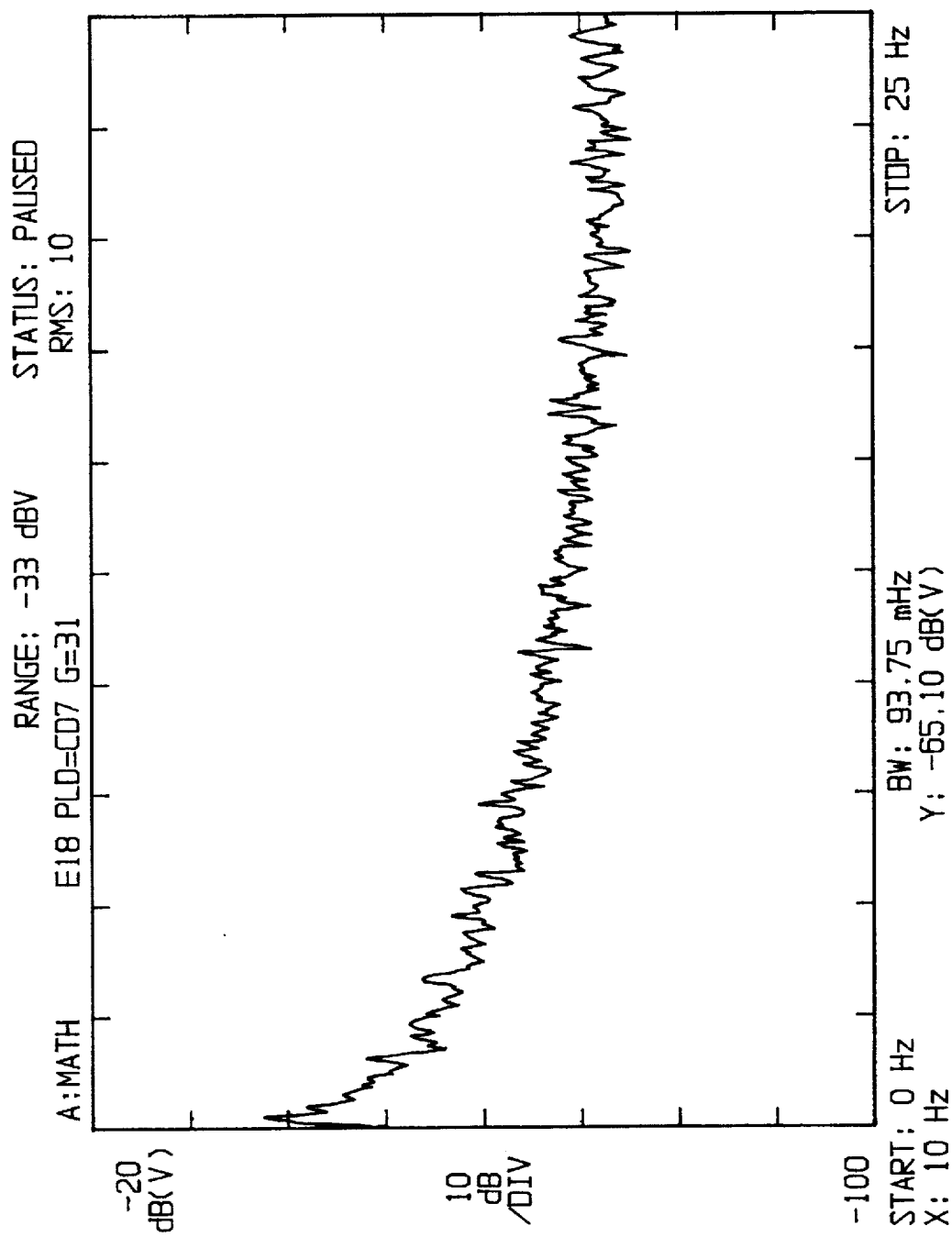
FIG. 5A is a chart corresponding to the chart of FIG. 2 illustrating the improvement in the output of an atomic frequency standard with the embodiment of FIG. 5.

The embodiment of FIG. 5 also provides an output frequency free of unwanted low frequency harmonics, which show up as spectrum spurs, as shown by comparison of FIG. 5A with FIG. 2, but is more susceptible to an unpredictable false lock characteristic in locking the VCO to the atomic resonant frequency.

Figure 6:
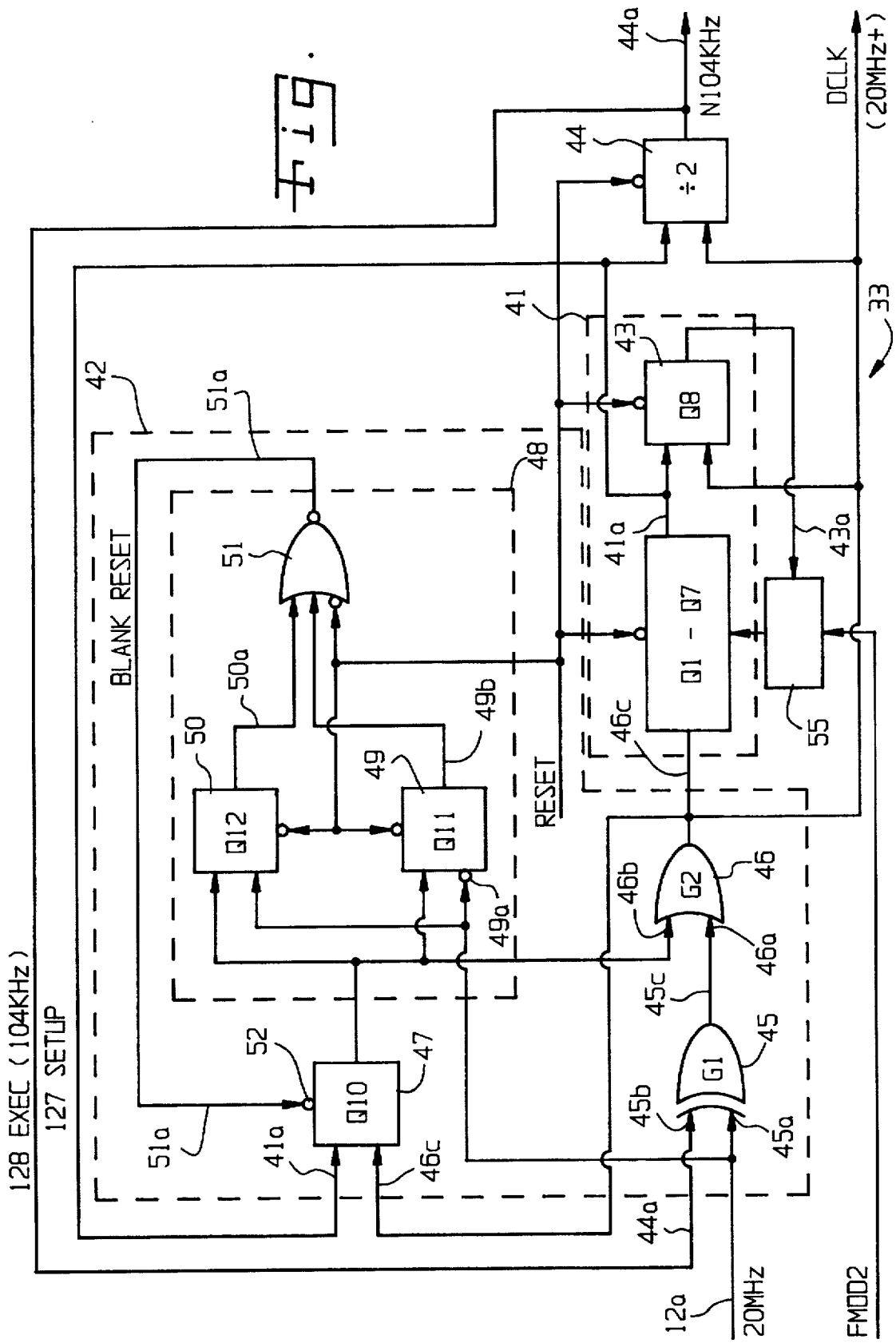
FIG. 6 is a block schematic diagram illustrating means for generating a frequency-modulated sub-multiple frequency with "integrally-adjacent" sub-multiples of the output frequency of a voltage controlled oscillator, and means of the invention for digitally delaying by one-half cycle, a pulse train, permitting a fractional division factor.
Figure 9A:
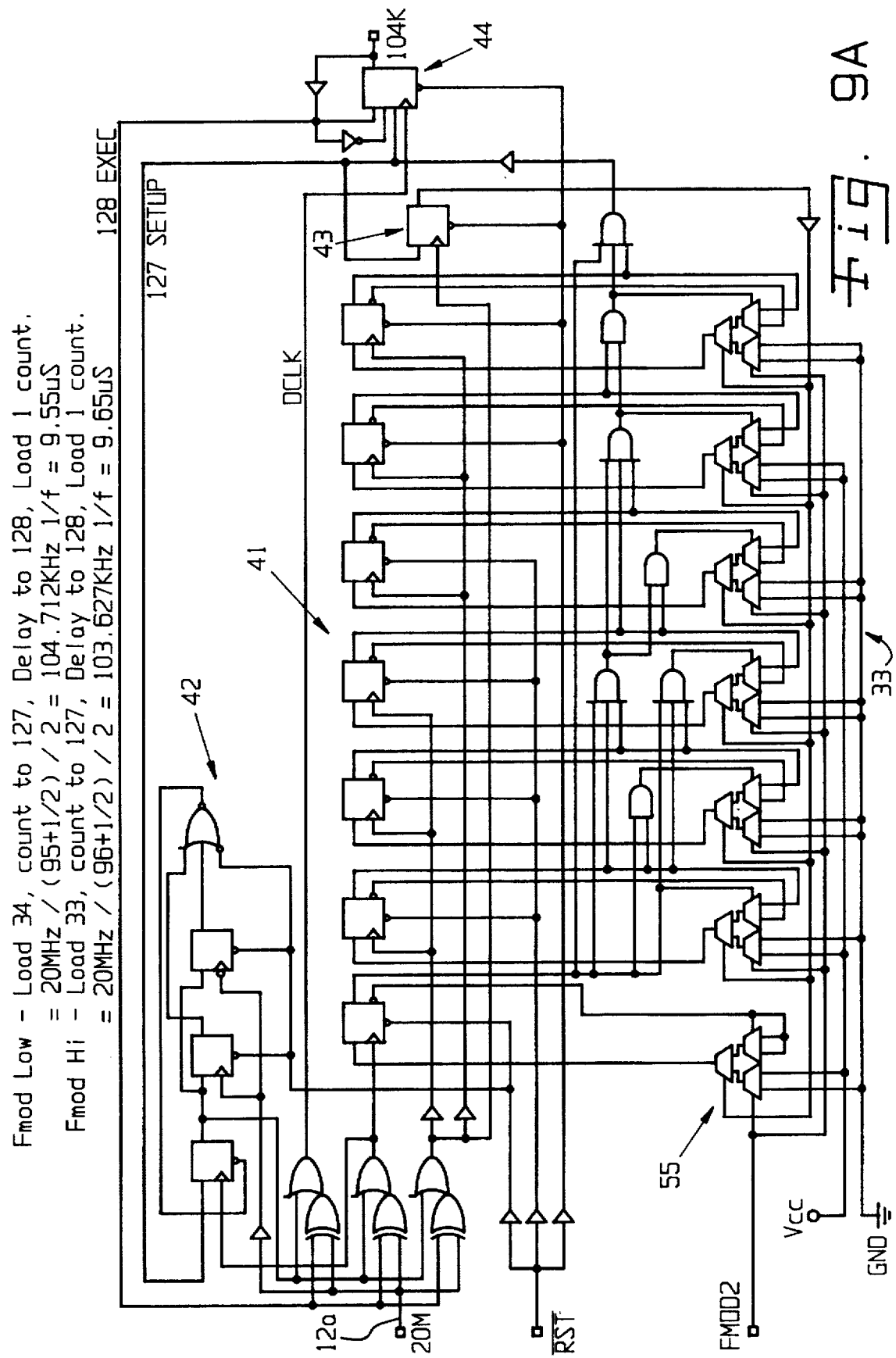
FIG. 9A is a more detailed block diagram of the counter of the FIG. 4 embodiment that provides modulation of the synthesized frequency (corresponding to FIG. 6)
Figure 9B:
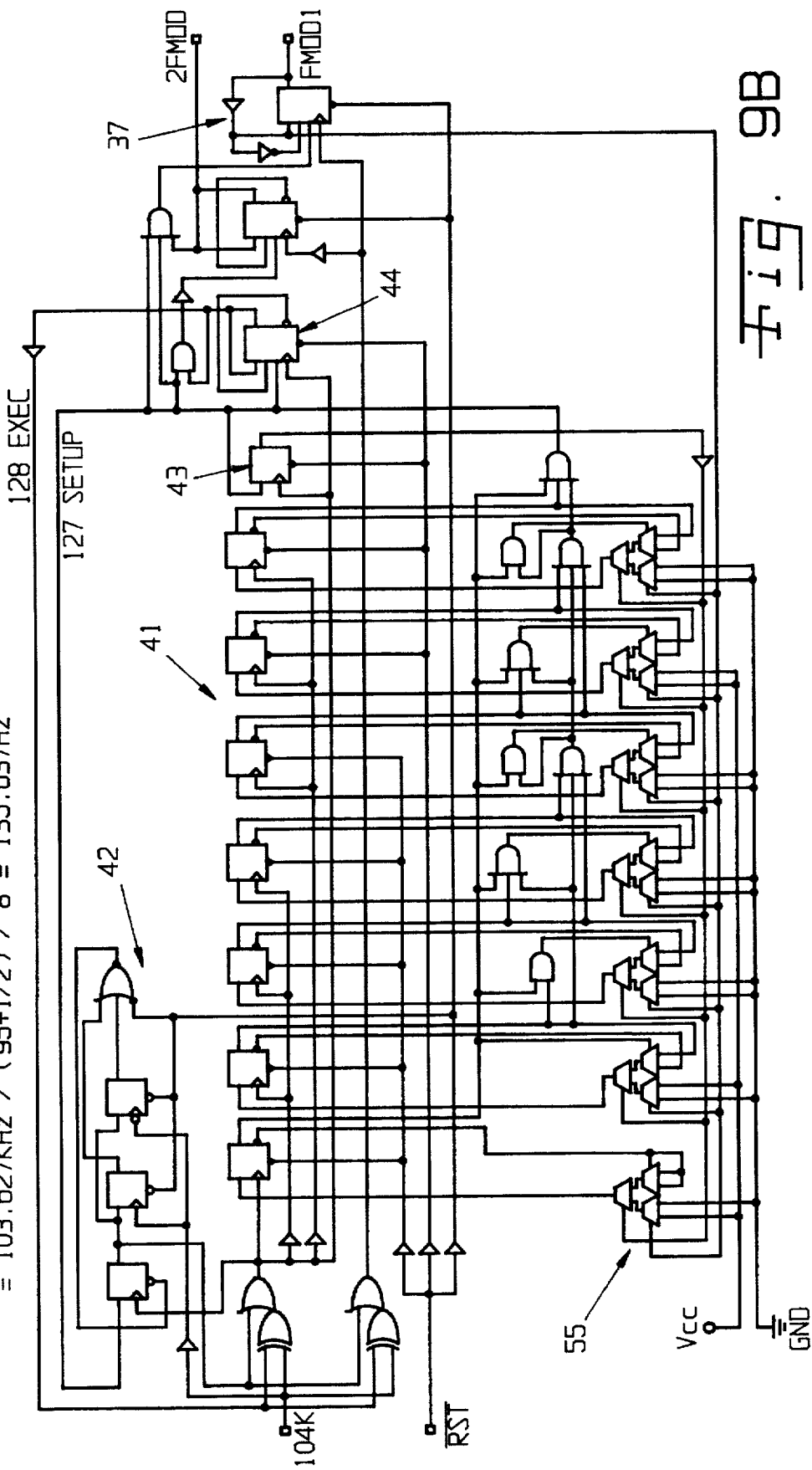
FIG. 9B is a correspondingly detailed block diagram of the counter of FIG. 4 that provides, from the output of the FIG. 9A counter, a modulation frequency with a 50 percent duty cycle.

FIG. 6 is a schematic block diagram of counter circuit 33 (FIG. 9A) and the major portion of counter circuit 34 (FIG. 9B). Counter circuits 33 and 34 differ only by the modulation frequency half cycle on which they preload, in their counters 41, the different count numbers (M and X) that are used to provide their integrally-adjacent division factors (circuit differences may be identified by comparison of FIGS. 9A and 9B). For example, when counter circuit 33 is preloading the count number to provide its division factor of 191, counter circuit 34 is preloading the count number to provide its division factor of 193, and vice versa. The counter circuit illustrated in FIG. 6 will therefore be described as counter circuit 33, although it should be understood that the description is equally applicable to operation of the major portion of counter circuit 34 as it would operate one-half cycle of the modulation frequency later. In addition, the counter circuit will be described as it operates to provide division factors of 191 and 193, for example, in the embodiment described above. It will be recognized, however, that the counter circuit 33 can be operated to provide other division factors, including those indicated below and in FIG. 11 for use in atomic frequency standards.

Counter circuits 33 and 34 each comprise a preloadable counter 41, a half cycle phase delay generator 42, a load generator 43 and a counter 44 dividing the output of preloadable counter 41 by a factor of 2. The preloadable counter 41 is an N-count counter, that is, it is a counter that has a maximum count value of N and at the Nth count, can be reset for another counting cycle. In the counting circuit 33 of this embodiment, preloadable counter 41 is a 128-count counter (N=128) and recycles at the "128 count". Counter 41 is preloadable and is preloaded with a number M and with a number M+1 (X=M+1) on alternate half cycles of the modulation frequency. As explained more fully below, the one-half cycle phase delay generator 42 illustrated in FIG. 6 operates in the described embodiment to effect division of the incoming pulse train by 95½ and 96½, and thereafter division of this result by 2 effects the division factors of 191 and 193 to frequency modulate of the incoming pulse train. For example, where the incoming pulse train is 20 MHz, the synthesized frequency-modulated signal can be varied from 104.712 kHz and 103.627 kHz as described below.

FIGS. 7 and 8 indicate the various signals present in the operation of half cycle phase delay generator 42, at the beginning (FIG. 7) and at the end (FIG. 8) of each cycle of operation of counter 41 to delay the source output, or clock, frequency pulse train 12a by one-half cycle. FIG. 7 illustrates the waveforms associated with the positive transition of the nominal 104 kHz in which the incoming pulse train 12a is delayed by one-half cycle to provide a half cycle delayed pulse train labeled $D_{CLK}$ in FIGS. 7-8. FIG. 8 illustrates the various waveforms at the negative transition of the nominal 104 kHz and illustrates the use of the falling transitions at the trailing edges of the input pulse train 12a and 104 kHz pulse train to delay the incoming pulse train 12a by a high cycle at the negative-going transition of the 104 kHz output and provide the half cycle delayed $D_{CLK}$ pulse train.

As described more fully below, $Q_1$–$Q_7$ are digital counters which count $2^7$ pulses and are preloadable or presettable with any number less than 128 to provide a pulse count of less than 128. As described below, in the frequency modulation generator of this embodiment, digital counters $Q_1$–$Q_7$ are alternatively loaded with the integrally-adjacent numbers 33 (M=33) and 34 (X=M+1=34), on alternate half cycles of the modulation frequency. In the following discussion of this embodiment, when we refer to the 127 pulse, we are referring to that pulse which is either 93 or 94 after the start of each counting cycle of the preloaded digital counters $Q_1-Q_7$, depending on whether the count is preloaded with 34 or 33, respectively.

Please note that it is only coincidence that the preload number 33 and 34 used to load counter 41 of FIG. 6 in the described embodiment corresponds to the element numbers that identify counters 331 and 34 in FIGS. 4-6.

As shown in FIG. 6, counter circuit 33 includes means 42 for digitally delaying by one-half cycle the input pulse train 12a which is to be divided by counting circuit 33 and the N counter 41. As described below, the half cycle phase delay generator circuit 42 permits the output of the N counter 41 to provide a fractional division factor, which can be divided by output divider 44 and provide integrally-adjacent division factors and integrally-adjacent sub-multiples of the input frequency. For example, the half cycle phase delay generator 42 in conjunction with the preloading of M and M+1 counts (where M=33) in the N counter 41, permits counter circuit 33 to generate integrally-adjacent division factors of 191 and 193 on alternating half cycles of the modulation frequency to generate the "integrally-adjacent" sub-multiple frequencies of 104.712 kHz and 103.627 kHz.

In the operation of the half cycle phase delay generator 42, the input pulse train 12a, for example, 20 MHz, is applied to one input 45a of an exclusive OR gate 45 and a pulse representing the output of counting circuit 33 is applied to the second input 45b of an exclusive OR gate 45. The higher frequency input pulse train 12a is shown at FIGS. 7A and 8A, respectively. The pulse representing the lower frequency output of counter circuit 33 is shown in FIGS. 7J and 8J, respectively. FIG. 7 illustrates the pulses and operation of the half cycle phase delay generator during a time including the positive-going transition of the pulse representing the lower frequency output of counter circuit 33, and FIG. 8 represents the pulses during operation of the half cycle phase delay generator during the time of the negative-going transition of the pulse representing the lower frequency output of counter circuit 33.

As a result of the phase reversal of the pulses of the input pulse train 12a (FIGS. 7A and 8A) occurring at and resulting from the phase reversal of the lower frequency pulse output of counter circuit 33 (FIGS. 7J and 8J), the output 45c of the exclusive OR gate 45 is a pulse train which, as shown in FIGS. 7B and 8B, is delayed by a half cycle at the beginning of each counting cycle of the N counter 41. Because of time delays in the operation of the counters and circuit components make up counter circuit 33 (that is, the time difference between the rise and fall times of the pulses of the input pulse train 12a at input 45a of exclusive OR gate 45 and the rise and fall times of the positive and negative-going transitions of the lower frequency out of pulse train out of counter circuit 33), transients, or "glitches", such as those shown in dash lines in FIGS. 7B and 8B, are likely to occur during the half cycle delay period, 45d. Such transients can be eliminated by the generation and use of a masking pulse, and by the application of the output of 45c of the exclusive OR gate 45 to one input 46a of an OR gate 46 and the application of the masking pulse, shown in FIGS. 7E and 8E, to a second input 46b of OR gate 46. Since the masking pulse of FIGS. 7E and 8E extends for at least substantially one-half cycle of the input pulse train 12a, the output 46c of OR gate 46 is maintained as shown in the solid lines 7A and 8B without transients, such as those indicated in the dash lines. The output 46c of OR gate 46 is thus a one-half cycle delayed pulse train DCLK at the higher frequency of the input pulse train 12a (that is, 20 MHz plus one-half cycle in each counting cycle of counter 41), which is applied to the N counter 41 for division to generate the lower frequency output pulse train of the counter circuit 33.

As indicated in FIG. 6, the masking pulse 47a is generated by a mask pulse generator 47. The N counter 41 provides a first output 41a when it reaches the 127 count, for example, when $Q_1-Q_7$ are all high as a result of counter 41 reaching a count of 127, first output 41a is applied to and sets the mask pulse generator 47 to be triggered by the pulse output of OR gate 46 which next follows the 127 count. As shown in FIGS. 7B and 8B, as the output of OR gate 46 (DCLK) goes high during the time of the 128 count, mask pulse generator 47 is triggered and generates the mask pulse 47a shown in FIGS. 7E and 8E, which is applied to the second input 46b of OR gate 46.

Mask generator 47 is reset by a blank reset generator 48 comprising first and second blank reset pulse generators 49 and 50 and a NOR gate 51. In operation of the blank reset generator 48, the mask pulse output of mask generator 47 sets the first and second blank pulse generators 49 and 50; the first blank reset pulse generator 49 is connected through an inverter 49a with the input pulse train 12a, and as a result of the inversion of the input pulses (12b shown in phantom lines above FIG. 7G) by the inverter 49a, the first blank reset pulse generator 49 is triggered by the falling transition of the 128 count pulse of input pulse train 12a next following the positive-going transition of the 104 kHz lower frequency shown in FIG. 7J (which is applied by inverter 49a as a rising transition of the inverted input pulse train 12b, as indicated at FIG. 7G) and generates a blank reset pulse 49b as shown in FIG. 7G, which is applied to the input of NOR gate 51. Because the other inputs of NOR gate 51 are high, the blank reset pulse of the first blank reset pulse generator 49 provides a negative-going blank reset pulse on the output 51a of the NOR gate 51, which is applied through an inverter 52 to clear mask pulse generator 47.

At the negative-going transition of the lower frequency pulse train output of counter circuit 33 (FIG. 8J), second blank reset pulse generator 50 (which is set by mask pulse output 47a of mask pulse generator 47, which occurs during the negative half cycle of the 128 count, as shown in FIG. 8E) is triggered by the input pulse of the input pulse train 12a which next follows the mask pulse 47a, as shown in FIG. 8F. The blank reset pulse 50a from second blank reset pulse generator 50 is applied to one input of NOR gate 51, and since the inputs to NOR gate 51 are high, NOR gate 51 generates a negative going blank reset pulse on its output 51a which clears the mask generator 47 following the negative-going transition of the lower frequency pulse train generated by counter circuit 33.

As shown in FIG. 6, the first output 41a which occurs after the 127 count when $Q_1-Q_7$ of counter 41 are all high, is applied to load generator 43 and sets load generator 43 so that the next pulse of the DCLK half cycle delayed high frequency pulse train output 46c of OR gate 46 (FIGS. 7B and 8B) triggers a load pulse 43a (FIGS. 7I and 8I) which has a duration equal to one cycle of the DCLK half cycle delayed higher frequency pulse train from OR gate 46 (equal in time to one and one-half cycles of the input frequency 12a) which is supplied to N counter 41. Load pulse 43a preloads counters $Q_1-Q_7$ with a number M (or a number M+1 depending upon the half cycle of the modulation frequency input ($f_{MOD}2$) to counter 41).

In the operation of this described embodiment of this invention, counter 41 is preloaded with the number 33 during alternate half cycles $f_{MOD}2$ (for example, the "low" or "0" half cycles) of the modulation frequency and provides its first output 41a after 94 input pulses from the output 46c of OR gate 46. Since there is a delay of up to about one cycle of the DCLK half cycle delayed high frequency input pulse train from the output 46c of OR gate 46 (a period of one and one-half 12a clock cycles) before load generator Q8 is triggered, and one cycle of the higher frequency pulse train input 12a is consumed in the load count of load generator 43, the N counter 41 recycles after 96½ counts (including the half cycle delay in the output of OR gate 46) and thereby provides a dividing factor 96½ during one set of alternate half cycles of the modulation frequency (e.g., the "low" or "0" half-cycles). On the other alternate set of half cycles of the modulation frequency (e.g., the "high" or "1" half cycles), counter 41 is preloaded with a count of 34, and the first output 41a of counter 41 occurs after the 93rd input pulse from the output 46c of OR gate 46. As indicated above, there is a delay of one cycle of the half cycle delayed input frequency (a period of one and one-half 12a clock cycles) in triggering load generator 43, and a one cycle load count so that counter 41 is recycled after 95½ counts (including the half cycle delay in the output 46c of OR gate 46), thus providing a dividing factor of 95½.

Divider 44 further divides the dividing factors of 95½ and 96½ that are generated by the half cycle phase delay generator and counter 41 by a factor of two to provide division factors of 191 and 193 at the output 44a. The varying nominal 104 kHz at the output 44a of divider 42 provides a lower frequency pulse train input (FIGS. 7J and 8J) at input 45b of exclusive OR gate 45 and, in the embodiments of FIGS. 4 and 5, constitutes the lowest sub-multiple of the three integrally-related sub-multiples of the frequency output 12a of the controllable frequency source 11, which, in the example above, changes between 104.712 kHz and 103.627 kHz, providing a modulation depth of 1085 Hz, as the frequency $f_{MIXER}3$ of FIG. 4.

As indicated in FIG. 4, counter circuit 34 is, in all respects, like the counter circuit 33 except for the modulation frequency half cycles in which N counter 41 is preloaded with the numbers 34 and 33, and further divides the $f_{MIXER}3$ frequency with synchronized division factors of 193 and 191 to provide an output which is 20 MHz divided 193×191, a frequency of 542.549 Hz, which is then divided by four in counter 37 to provide a modulation frequency of 135.637 Hz with a 50 percent duty cycle.

As indicated above, the invention includes a method of synthesizing a lower frequency output pulse train output from a higher frequency input pulse train by a applying the lower frequency output pulse train to one input of an exclusive OR gate and the higher frequency input pulse train to a second input of an exclusive OR gate so the exclusive OR gate operates to delay the higher frequency input pulse train by one-half cycle at the beginning of each half cycle of the lower frequency pulse train and thereby provides a half cycle delayed higher frequency pulse train, i.e., transition times occur one-half cycle later. As indicated above, subsequent digital division of the half cycle delayed higher frequency pulse train can provide a fractional dividing factor. In the method, transients generated during the period of the half cycle delay from circuit operating delays can be removed by generating a masking pulse at the beginning of each half cycle of the lower frequency pulse train and applying the masking pulse and the half cycle delayed higher frequency pulse train to an OR gate, the output of which is a half cycle delayed higher frequency pulse train without any transients. In the invention, the half cycle delayed higher frequency pulse train can be divided by a division factor of N and thereby generate an even lower frequency output pulse train. Division of the half cycle delayed higher frequency pulse train can be accomplished with a preloadable N counter and the division factor can be varied by preloading such a counter with a number M and a number X. With such a preloadable counter, frequency modulation of the half cycle delayed higher frequency pulse train can be effected by changing the preloaded number from M to X during alternate half cycles of the lower frequency output pulse train. For example, the numbers M and M+1 (X=M+1) can be loaded during alternate half cycles of the lower frequency pulse train in providing a frequency-modulated lower frequency pulse train. In the invention, such a frequency-modulated lower frequency pulse train can be used, or further divided and used, as described above, in the synthesis of an interrogation frequency for the physics package of an atomic frequency generator by its application, with other sub-multiples of the higher frequency input pulse train, to an exclusive OR gate to mix the frequencies in the generation of a synthesized interrogation frequency. In addition, the frequency-modulated lower frequency pulse train can be further divided in a synchronous manner, as described above, to provide a modulation frequency with a 50 percent duty cycle.

FIGS. 9A and 9B are more detailed block diagrams of the counter circuits 33 and 34.

Figure 10:
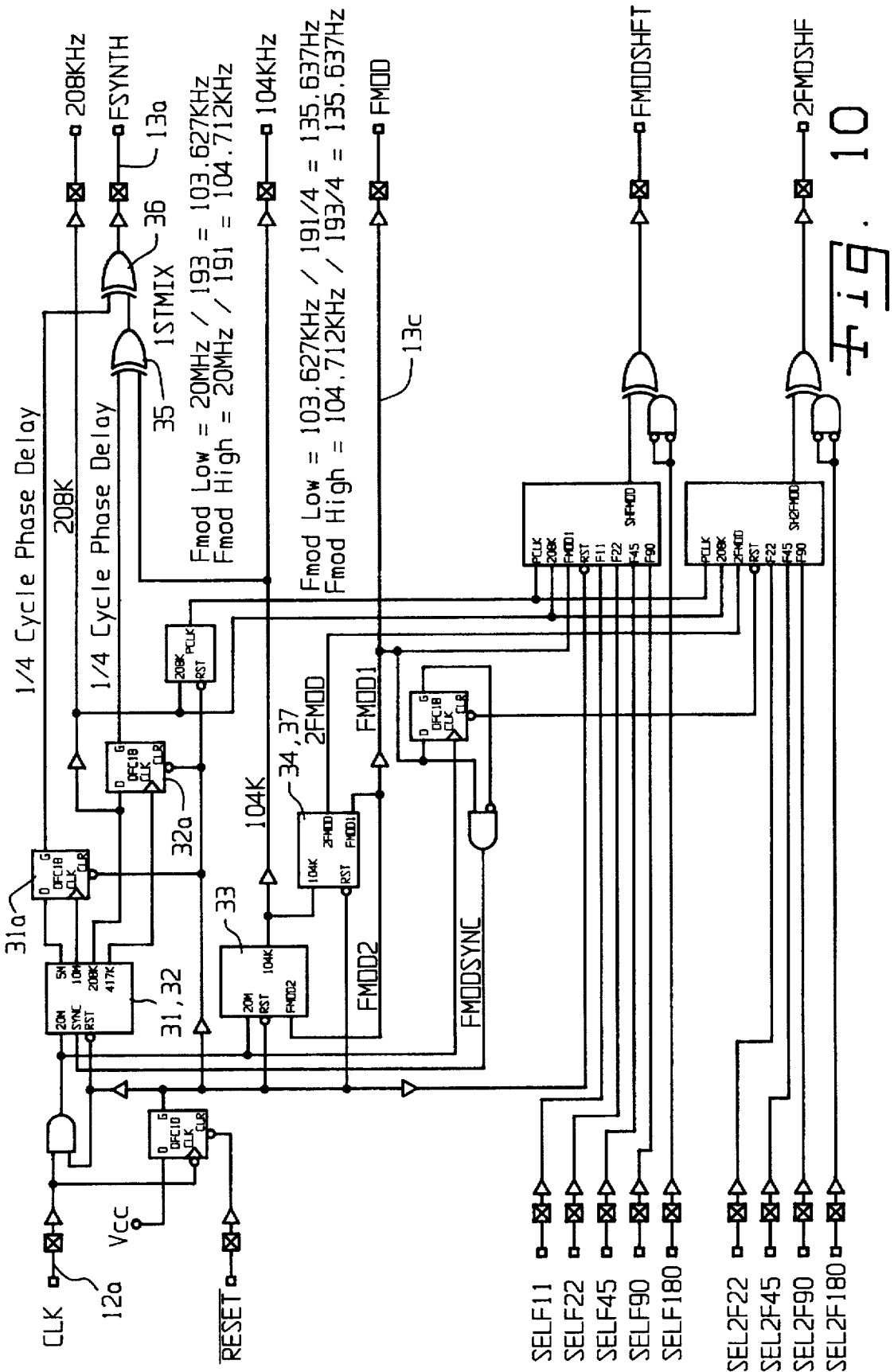
FIG. 10 is a more detailed block diagram of the entire digital frequency synthesizer of FIG. 4.

FIG. 10 is a more complete block diagram corresponding to FIG. 4 and illustrates the element inter-connections and the associated buffering and pulse-forming elements, and synchronization of the components.

While the invention has been described above with an exemplary embodiment including a clock frequency of 20 MHz and integrally-related sub-multiple frequencies of 5 MHz, 208.333 kHz and a nominal 104.167 kHz modulated at 104.712 and 103.626 kHz, the invention provides the selection of other sets of integrally-related sub-multiple frequencies derived from an output frequency of an atomic frequency standard. In synthesizing a frequency-modulated interrogation frequency for the physics package of an atomic frequency standard from an output of a controllable frequency source, the plurality of sub-multiple frequencies are preferably selected from a set of integrally-related sub-multiple frequencies derived from a clock frequency that is derived from or equal to the output frequency of the controllable frequency source. Each of the integrally-related sub-multiple frequencies of the set is a sub-multiple of the clock frequency ($f_{CLK}$) including a first frequency ($f_1$) equal to the clock frequency divided by a division factor $d_1$, a second frequency ($f_2$) equal to the clock frequency divided by a division factor $d_2$, and a third frequency ($f_3$) equal to the clock frequency divided by a division factor $d_3$, and division factor $d_1$ is less than division factor $d_2$ which is less than or equal to division factor $d_3$, $d_1$, $d_2$ and $d_3$ being whole numbers. In the set, the quantities $d_2$ divided by $d_1$, $d_3$ divided by $d_1$, and $d_3$ divided by $d_2$, are all powers of the number 2, and $d_3$ divided by $d_2$ can be equal to 1, which is the zero power of 2. In the set, a whole number Y times the quantity $f_1 \pm f_2 \pm f_3$ plus a whole number Z times the clock frequency is equal to the atomic resonant frequency $f_{RES}$. FIG. 11 illustrates such criteria and a set from which operating frequencies and division factors can be selected in the methods and apparatus of the invention. The sub-multiple frequencies of Table 11 have been derived for a clock frequency of 20 MHz; however, those skilled in the art will recognize that other clock frequencies may be used as the art of digital equipment permits the economic generation and use of higher operating speeds and shorter circuit delays.

As indicated in FIG. 11, it is generally preferable to select one of the second and third frequencies ($f_2$ or $f_3$) for frequency modulation and to modulate the selected frequency by changing it between two numerically derived sub-multiple frequencies which integrally-adjacent. As indicated from the description above, numerically derived sub-multiple frequencies of the frequency-modulated frequency can be derived by dividing the clock frequency with the division factor that is alternatingly incremented with a number E, which equals h times ±½, where h is a whole number. For example, in the embodiment described above, the frequency-modulated frequency was derived by dividing a clock frequency of 20 MHz by division factors of 191 and 193 on alternate half cycles of the modulation frequency, that is, a division factor of 192 was alternatingly incremented with the number 1 (i.e., h=2, E=2×±½). The frequencies and division factors selected for use in the embodiment described above were selected to provide a compromise in operation in which the crystal false lock frequency generated by the operation was approximately 304 Hz at 10 MHz output and the modulation depth of the frequency-modulated interrogation signal was about 1085 Hz. The crystal false lock frequency 304 Hz lies acceptably beyond the frequency capture range of the atomic frequency standard control, thus reducing the possibility that the controllable frequency standard will be locked to other than the atomic resonance frequency. In addition, the modulation depth of 1085 kHz lies comfortably within the atomic bandwidth of about 800 to about 2000 Hz, which is typical of physics package of a commercial atomic frequency standard. However, the 1085 Hz modulation depth does not provide optimal performance of the physics package, but reduces achievable gains by as much as 30 percent.

In the invention, however, other sets of frequencies may be selected for synthesizing an interrogation frequency in an atomic frequency standard. For example, false lock frequencies generated in the operation of atomic frequency standard can be further positioned outside of the capture range of the atomic frequency standard control by selecting, where the clock frequency is equal to 20 MHz, a frequency $f_1$ of 5 MHz through the use of division factor $d_1$=4, and frequencies $f_2$ and $f_3$ both equal to 156.25 kHz by using division factors $d_2$ and $d_3$ equal to 128. In effecting frequency modulation, either the frequency $f_2$ or $f_3$ can be frequency-modulated by alternately incrementing the division factor 128 with plus or minus one-half (i.e., h=1, E=±½), to change the modulated frequency between about 156.863 kHz and about 155.642 kHz. Such operation provides a false crystal lock frequency of about 457 Hz which is substantially removed from the capture range of the control of a commercial atomic frequency standard, but provides a greater modulation depth of 1220 Hz.

In order to more closely match the modulation depth of the interrogation frequency with the higher gain characteristics of the physics package of a commercial atomic frequency standard, the frequencies can be selected to provide, with a 20 MHz clock frequency, a frequency $f_1$ of 5 MHz with a division factor of $d_1$=4, a frequency $f_2$ of 250 kHz with a division factor $d_2$=80 and a frequency $f_3$ of 62.5 kHz with a division factor $d_3$=320, and the frequency $f_3$ can be frequency-modulated by changing it between about 62.893 kHz and about 62.112 kHz by alternately incrementing the division factor $d_3$ of 320 with ±2, (i.e., h=4 and E=4×±½). In this selection of frequencies, the modulation depth of the frequency-modulated interrogation signal is approximately 781 Hz which closely proximates the 800 Hz bandwidth of the physics package at which frequency differences in the interrogation signal provide the greatest amplitude variation in the control output signal, thereby improving the ability of the atomic frequency standard to remain locked to the atomic resonance frequency. This selection of operating frequencies, however, provides a crystal lock frequency of about 182 Hz which is more closely adjacent the capture range of the atomic frequency standard control.

In methods and apparatus of the invention, a frequency synthesizer for generating an interrogation signal for the physics package of an atomic frequency standard can be operated in more than one mode by providing a first set of plural, integrally-related sub-multiple frequencies for operating the atomic frequency standard in the first mode and providing one or more other sets of plural, integrally-related sub-multiple frequencies for operating the atomic frequency standard in one or more other modes. For example, a first set of plural, integrally-related sub-multiple frequencies can be selected, for example, from the criteria of FIG. 11 for operation of the controllable frequency source when it is not locked to the atomic resonance frequency and a second set of plural, integrally-related sub-multiple frequencies can be selected for operation of the atomic frequency standard when the controllable frequency source is locked to the atomic resonance frequency. In the non-lock mode, for example, the first set of plural, integrally-related sub-multiple frequencies can be selected to provide operation of the atomic frequency standard without generating a false lock frequency within the frequency capture range of the control for the controllable frequency source and the second set of plural, integrally-related sub-multiple frequencies can be selected for operation of the atomic frequency source with a frequency modulation depth providing optimal performance of the physics package, both sets of frequencies being selected from the criteria of FIG. 11 as set forth above.

Thus, through the selection of component frequencies of a synthesized frequency using the criteria of the invention, a digital frequency synthesizer can provide improved operation of an atomic frequency standard with one or more integrally-related sub-multiples of a clock frequency in which one of the integrally-related sub-multiple frequencies is incrementally varied to provide frequency modulation between integrally-adjacent sub-multiple frequencies. In addition, the use of synchronous synthesis and proper phasing of the integrally-related sub-multiple frequencies and the modulation frequency in their generation and mixing can provide a frequency spectrum free of unwanted harmonics and improved performance of an atomic frequency standard. The invention provides method and apparatus which can reduce false lock possibilities, optimize the ability of the physics package to remain locked to the atomic transition frequency, and reduce phase noise in the output of an atomic frequency standard.

While the above description and drawings illustrate currently known best modes of the invention, those skilled in the art will recognize that variations in the apparatus and methods illustrated and described above can be effected without departing from the scope of the invention as set forth in the following claims.

We claim:

1. In an atomic frequency standard including a controllable frequency source for generating a source output frequency, a physics package for generating an atomic transition frequency through the excitation of an atomic gas; means for generating, from the source output frequency, a modulated interrogation frequency; means for injecting and mixing said modulated interrogation frequency with said atomic transition frequency; means for generating a signal proportional to the difference between said atomic transition frequency and said modulated interrogation frequency; and means for controlling said controllable frequency source from said signal and for locking said controllable frequency source to said atom transition frequency, the improvement wherein said means for generating, from the source output frequency, a modulated interrogation frequency comprises: digital means for synchronously synthesizing a plurality of integrally-related sub-multiple frequencies of said source output frequency and an integrally-related modulation frequency, one of said integrally-related sub-multiple frequencies being frequency-modulated at said integrally-related modulation frequency; and means for digitally mixing said plurality of integrally-related sub-multiple frequencies, including said frequency-modulated sub-multiple frequency, in synthesizing said modulated interrogation frequency.

2. The improvement of claim 1 wherein at least two of said plurality of integrally-related sub-multiple frequencies are synchronously synthesized by periodically resetting the digital means by which said at least two frequencies are synthesized.

3. The improvement of claim 1 wherein said digital means for synchronously synthesizing a plurality of integrally-related sub-multiple frequencies comprises a plurality of digital counting means, and at least two of said plurality of integrally-related sub-multiple frequencies are synchronously synthesized and periodically reset at a rate which is a multiple or sub-multiple of the modulation frequency.

4. The improvement of claim 1 wherein said digital means for synchronously synthesizing a plurality of integrally-related sub-multiple frequencies comprises common digital means used in the synthesis of at least two of said plurality of integrally-related sub-multiple frequencies.

5. The improvement of claim 1 wherein said means for digitally mixing said plurality of integrally-related sub-multiple frequencies includes a plurality of exclusive OR gates, and wherein said plurality of integrally-related sub-multiple frequencies are mixed by said plurality of exclusive OR gates in synthesizing said modulated interrogation frequency, and at least two of said plurality of integrally-related sub-multiple frequencies are phased at the inputs of said plurality of exclusive OR gates to offset the transition times of said plurality of sub-multiple frequencies at said inputs.

6. The improvement of claim 1 wherein said frequency-modulated one of said integrally-related sub-multiples of said source output frequency is digitally varied on alternating half cycles of said modulation frequency to provide two integrally-adjacent sub-multiples of said source output frequency on alternating half cycles of said modulation frequency and to generate said frequency-modulated one of said integrally-adjacent sub-multiples being generated by a division factor d+E, where d is a whole number, and E equals a whole number h times ±½, and said digital variation is effected by alternating E between a positive and a negative number on alternating half cycles of said modulation frequency.

7. The improvement of claim 6 wherein said frequency-modulated one of said integrally-related sub-multiple frequencies is further divided and further digitally varied on alternating half cycles of the modulation frequency in generating said modulation frequency, said digital variations being synchronized so that said source output frequency is divided by division factors of $\{d \times (d+E)\}$ during each alternating half cycle of said modulation frequency to generate frequency modulation with a 50 percent duty cycle.

8. The improvement of claim 6 wherein said division factors generated by d+E, where E alternates between a positive and a negative number, provides a frequency-modulated lowest sub-multiple frequency with a maximum frequency variation approximately the bandwidth of the atomic transition frequency.

9. The improvement of claim 6 wherein said frequency-modulated one of said integrally-related sub-multiple frequencies is further divided by a division factor $d_m$ sufficiently high to provide a modulation frequency whose departure from 50 percent duty cycle is small enough that frequency harmonics generated by its departure from a 50 percent duty cycle do not unacceptably affect the means for controlling the controllable frequency source and locking said source output frequency to said atomic transition frequency.

10. The improvement of claim 9 wherein said frequency-modulated one of said plurality of integrally-related sub-multiple frequencies is synchronized with another of the integrally-related sub-multiple frequencies with which it is digitally mixed.

11. The improvement of claim 1 wherein said source output frequency ($f_{CLK}$) is divided by a first counter with a division factor $d_1$ to provide an integrally-related sub-multiple frequency ($f_1$), and is also divided by a second counter with a division factor $d_2$ to provide an integrally-related sub-multiple frequency ($f_2$), and is also divided by a third counter with a division factor $d_3$ to provide an integrally-related sub-multiple frequency ($f_3$).

12. The improvement of claim 11 wherein $d_1 < d_2 \le d_3$; $d_1$, $d_2$, and $d_3$ are whole numbers, and $d_2/d_1 = 2^e$, $d_3/d_1 = 2^f$ and $d_3/d_2 = 2^g$, where e, f and g are whole numbers and g can equal 0, and wherein $Y(f_1 \pm f_2 \pm f_3) + Z f_{CLK}$ equals the atomic transition frequency, Y and Z being whole numbers.

13. The improvement of claim 12 wherein at least one of $f_1$, $f_2$ and $f_3$ is frequency-modulated with a 50 percent duty cycle.

14. The improvement of claim 12 wherein the crystal false lock frequency is greater than the frequency capture range of the control of the atomic frequency standard.

15. The improvement of claim 12 wherein said digital means of synchronously synthesizing a plurality of integrally-related sub-multiple frequencies of said source output frequency and an integrally-related modulation frequency operates in a non-lock mode providing a false oscillator lock frequency outside of the frequency adjustment range of the controllable frequency source and a lock mode optimizing the frequency modulation depth for the physics package.

16. The improvement of claim 15 wherein said second and third counters are preloadable counters, and are preloaded with a first set numbers for operation in the non-lock mode, and a second set of numbers for operation when said controllable frequency source is locked to said atomic transition frequency.

17. The improvement of claim 16
wherein $f_1$ equals 5 MHz, and
wherein during the non-lock mode the second counter is preloaded with a number providing $f_2$ equal to 156.25 kHz and the third counter is alternatingly preloaded with two different numbers in alternating half cycles of the modulation frequency to change $f_3$ between about 156.862 kHz and about 155.642 kHz in alternating half cycles of the modulation frequency, and wherein during the lock mode the second counter is preloaded with a number providing $f_2$ equal to 250.000 kHz and the third counter is alternatingly preloaded with two different numbers in alternating half cycles of the modulation frequency to change $f_3$ between about 62.893 kHz and about 62.111 kHz in alternating half cycles of the modulation frequency.

18. The improvement of claim 11 wherein said third counter comprises said digital means used for synthesis of said one of said integrally-related sub-multiple frequencies being frequency-modulated and said integrally-related modulation frequency.

19. The improvement of claim 11 wherein said source output frequency is delayed by one-half cycle prior to each division cycle of said third counter to provide a third counter fractional division factor $d_3+\frac{1}{2}$.

20. The improvement of claim 1 wherein said digital means for synthesizing, from said source output frequency, a digitally-formatted interrogation frequency comprises a first counter with a division factor for dividing said source output frequency to provide a highest sub-multiple frequency output, a second counter with a division factor for dividing said source output frequency to provide an intermediate sub-multiple frequency output, a third counter with a division factor for dividing said source output frequency to provide a lowest sub-multiple frequency output, delay means for at least two of said sub-multiple frequency outputs of said counters, a first exclusive OR mixer for mixing of two sub-multiple frequency counter outputs and providing a first mixed sub-multiple frequency output, at least one of said two sub-multiple frequency counter outputs being delayed, and a second exclusive OR mixer for mixing said first mixed sub-multiple frequency output with the remaining sub-multiple frequency counter output, said remaining sub-multiple frequency counter output being delayed.

21. The improvement of claim 20 wherein said digital means further comprises a half cycle delay generator for delaying said source output frequency by one-half cycle of said source output frequency and generating a half cycle delayed source output frequency, said half cycle delayed source output frequency being connected with the input of said third counter, said third counter operating to divide said half cycle delayed source output frequency during each half cycle of the lowest sub-multiple frequency.

22. The improvement of claim 21 wherein said third counter is a preloadable N counter, N being the maximum counter value, and is preloaded with different numbers less than N on alternating half cycles of said modulation frequency to provide differing sub-multiples $d_3'$ and $d_3''$ of said source frequency output and to generate frequency modulation of said lowest of said integrally-related sub-multiple frequencies.

23. The improvement of claim 22 wherein said third counter is preloaded with integrally-adjacent numbers M and M+1 on alternating half cycles of said modulation frequency and provides a frequency-modulated lowest sub-multiple of said source output frequency, said frequency-modulated lowest sub-multiple of said source output frequency comprising said source output frequency divided by division factors where $d_3'$ equals (N−M+½) and $d_3''$ equals (N−M−½) on alternating half cycles of said modulation frequency.

24. The improvement of claim 23 wherein the frequency-modulated lowest sub-multiple of said source output frequency is further divided by 2.

25. The improvement of claim 23 wherein said frequency-modulated lowest sub-multiple of said source output is further divided by a fourth preloadable N counter, N being the maximum counter value, said fourth preloadable N counter being preloaded with the number M on the modulation frequency half cycles during which the third counter is loaded with M+1, and preloaded with the number M+1 on the modulation frequency half cycles during which the third counter is loaded with M, the output of said fourth preloadable N counter comprising a digitally-formatted frequency with a 50 percent duty cycle.

26. The improvement of claim 25 wherein said digitally-formatted frequency with a 50 percent duty cycle is applied to a fifth counter and further divided to provide said modulation frequency.

27. The improvement of claim 25 wherein said source output frequency is 20 MHz and said digital means further includes a divide by two counter at the output of said third counter and a divide by eight counter at the output of said fourth counter, and said division factors $d_1$, $d_2$, $d_3'$ and $d_3''$ are respectively 4, 96, 191 and 193 respectively.

28. The improvement of claim 23 wherein said frequency-modulated lowest sub-multiple of said source output frequency is further divided by a high count counter providing a division factor $d_m$ sufficiently high that the digitally-formatted modulation frequency output of the high count counter departs from a 50 percent duty cycle so slightly that said means for controlling said frequency source can operate acceptably.

29. The improvement of claim 28 wherein said source output frequency is 20 MHz and said division factors $d_1$, $d_2$, $d_3'$ and $d_3''$ are, respectively, 4, 96, 191 and 193, and the division factor $d_m$ of said high count counter is 768.

30. The improvement of claim 22 wherein said source output frequency is 20 MHz and said division factors $d_1$, $d_2$, $d_3'$ and $d_3''$ are 4, 96, 191 and 193, respectively.

31. In an atomic frequency standard including a controllable frequency source for generating a source output frequency, a physics package for generating an atomic transition frequency through the excitation of an atomic gas; means for generating, from the source output frequency, a modulated interrogation frequency; means for injecting and mixing said modulated interrogation frequency with said atomic transition frequency; means for generating a signal proportional to the difference between said atomic transition frequency and said modulated interrogation frequency; and means for controlling said controllable frequency source from said signal and for locking said controllable frequency source to said atom transition frequency, the improvement wherein said means for synthesizing, from the source output frequency, a modulated interrogation frequency comprises: digital means for synthesizing a plurality of integrally-related sub-multiple frequencies of said source output frequency and an integrally-related modulation frequency, one of said integrally-related sub-multiple frequencies being frequency-modulated at said integrally-related modulation frequency; and means for digitally mixing said plurality of integrally-related sub-multiple frequencies, including said frequency-modulated sub-multiple frequency, in synthesizing said modulated interrogation frequency, said digital means for synthesizing, from said source output frequency, said plurality of integrally-related sub-multiple frequencies and said integrally-related modulation frequency operating in a non-lock mode that provides a false lock frequency outside of the frequency capture range of the means for controlling said controllable frequency source and in a lock mode that provides frequency modulation depth approximately the atomic bandwidth of the physics package.

32. The improvement of claim 31 wherein said digital means for synthesizing, from said source output frequency, said plurality of integrally-related sub-multiple frequencies of said source output frequency and said integrally-related modulation frequency comprises a plurality of recycling digital counters for providing, from said source output frequency, said plurality of integrally-related sub-multiple frequencies, one or more of said recycling digital counters being preloadable and preloaded with a first set of numbers for operation in the non-lock mode and with a second set of numbers for operation in the lock mode.

33. The improvement of claim 32 wherein at least one preloadable counter is preloaded with two different numbers on alternating half cycles of the modulation frequency to change said one frequency-modulated frequency of said plurality of integrally-related sub-multiple frequencies during alternating half cycles of the modulation frequency.

34. A method of synthesizing a frequency-modulated frequency from an output frequency $f_{CLK}$ of a controllable frequency source of an atomic frequency standard for interrogating its physics package and locking said controllable frequency source to an atomic resonance frequency, comprising synthesizing said frequency-modulated interrogation frequency from a plurality of integrally-related frequencies derived from said output frequency, providing a first set of plural, integrally-related frequencies for operating said atomic frequency standard in a first mode, and providing a second set of plural, integrally-related frequencies for operating said atomic frequency standard in a second mode, said first set of plural, integrally-related frequencies being provided when said controllable frequency source is not locked to said atomic resonance frequency, and said second set of plural, integrally-related frequencies being provided when said controllable frequency is locked to said atomic resonance frequency.

35. The method of claim 34 wherein said first set of plural, integrally-related frequencies provides operation of said atomic frequency standard without generating a false lock frequency within the frequency adjustment range of the controllable frequency source, and said second set of plural, integrally-related frequencies provides operation of said atomic frequency standard with a frequency modulation depth selected for good performance of said physics package.

36. The method of claim 35 wherein said second set of plural, integrally-related frequencies provides a frequency modulation depth approximating the maximum gain signal amplitude characteristic of the physics package.

37. The method of claim 34 wherein said first and second sets of plural, integrally-related frequencies each include at least three integrally-related sub-multiple frequencies derived from said output frequency $f_{CLK}$ of said controllable frequency source, said first frequency $f_1$ of each said set being derived by dividing the output frequency $f_{CLK}$ by a factor $d_1$, said second frequency $f_2$ of each said set being derived by dividing said output frequency $f_{CLK}$ by a factor $d_2$, and said third frequency $f_3$ of each said set being derived by dividing said output frequency $f_{CLK}$ by a factor $d_3$;

wherein, for each said set, division factor $d_1$ is less than division factor $d_2$, which is less than or equal to division factor $d_3$, where $d_1$, $d_2$ and $d_3$ are whole numbers, and $d_2 \div d_1$ is equal to $2^e$, $d_3 \div d_1$ is equal to $2^f$, and $d_3 \div d_2$ is equal to $2^g$, e and f being whole numbers and g being 0 or a whole number, and wherein, for each said set, Y times the sum of $f_1$, $f_2$ and $f_3$ plus Z times the output frequency $f_{CLK}$ equals the atomic transition frequency, Y and Z being whole numbers.

38. The method of claim 37 wherein at least one of the frequencies $f_2$ and $f_3$ of each said set is frequency-modulated with a 50 percent duty cycle.

39. The method of claim 37 wherein $f_3$ of said first set of plural integrally-related frequencies provides a false lock frequency greater than the frequency capture range of the controllable frequency device.

40. The method of claim 37 wherein at least one of the frequencies $f_1$, $f_2$ and $f_3$ of said second set of plural integrally-related frequencies is frequency-modulated, and the modulation depth of said one frequency is in the range of about 600 to about 2000 Hz, peak to peak.

41. The method of claim 40 wherein the modulation depth of said one frequency is about 800 Hz, peak to peak.

42. The method of claim 40 wherein said at least one of the frequencies $f_1$, $f_2$ and $f_3$ is derived by dividing the output frequency $f_{CLK}$ by one of the division factors $d_1$, $d_2$ or $d_3$ plus a number E, where E equals a whole number h times $\pm\frac{1}{2}$ and where E alternates between a positive and a negative number on alternate half cycles of said modulation frequency to provide frequency modulation of said one frequency.

43. The method of claim 42 wherein $f_3$ of said first set of plural, integrally-related frequencies provides a false lock frequency greater than the frequency capture range of the controllable frequency source.

44. The method of claim 43 wherein the atomic resonance frequency is for rubidium; the output frequency $f_{CLK}$ equals 20 MHz and $f_1$ of said first and second sets of plural integrally-related sub-multiple frequencies equals 5 MHz;

wherein $f_2$ and $f_3$ of said first set of said plurality of integrally-related sub-multiple frequencies is 156.250 kHz, $f_3$ being frequency-modulated between about 156.862 kHz and about 155.642 kHz; and where $f_2$ of said second set of plural integrally-related sub-multiple frequencies is 250.000 kHz and $f_3$ of said second set of plural integrally-related sub-multiple frequencies is about 62.500 kHz frequency-modulated between about 62.893 of kHz and about 62.111 kHz.

45. A method of synthesizing a frequency-modulated frequency from a clock frequency derived from an output of a controllable frequency source of an atomic frequency standard for interrogating its physics package and locking said controllable frequency source to an atomic resonance frequency, comprising selecting a plurality of frequencies from a set of integrally-related frequencies, each of said selected integrally-related frequencies of said set being a sub-multiple of said clock frequency ($f_{CLK}$) including a first frequency ($f_1$) equal to the clock frequency divided by a division factor $d_1$, a second frequency ($f_2$) equal to the clock frequency divided by a division factor $d_2$, and a third frequency ($f_3$) divided by a division factor $d_3$, wherein $d_1 < d_2 \leq d_3$, and $d_1$, $d_2$ and $d_3$ are whole numbers, wherein $d_2/d_1=2^e$, $d_3/d_1=2^f$ and $d_3/d_2=2^g$, and e and f are whole numbers and g is zero or a whole number, and wherein $Y(f_1 \pm f_2 \pm f_3)+Z(f_{CLK})$=the atomic resonance frequency, Y and Z being whole numbers, and wherein one of said second and third frequencies is selected for frequency modulation and is frequency-modulated by dividing said clock frequency $f_{CLK}$ by a division factor that is alternatingly incremented with a number E, where E equals a number h times ±½, the resulting positive and negative E being the numbers by which the frequency modulation division factor is alternatingly incremented, h being any whole number except 2; and synthesizing said frequency-modulated frequency from said plurality of selected integrally-related frequencies.

46. In an atomic frequency standard in which an interrogation frequency for a physics package is generated from a plurality of integrally-related sub-multiple frequencies derived from an output frequency of the atomic frequency standard, the improvement comprising digital means for synchronously synthesizing at least two of said plurality of integrally-related sub-multiple frequencies, including a frequency-modulated sub-multiple frequency and a modulation frequency of the frequency-modulated frequency.

47. The improvement of claim 46 wherein at least two of said plurality of integrally-related sub-multiple frequencies are synchronously synthesized and periodically reset to obtain and maintain a phase relationship between the digital means by which said at least two frequencies are synthesized.

48. The improvement of claim 46 wherein said plurality of integrally-related sub-multiple frequencies are synthesized by a plurality of digital counting means, and at least two of said plurality of integrally-related sub-multiple frequencies are synchronously synthesized by periodically resetting the digital counting means to obtain and maintain a phase relationship between the digital counting means by which at least two frequencies are synthesized.

49. The improvement of claim 48 wherein at least two of said plurality of counting means are periodically reset to obtain and maintain a phase relationship between the digital counting means at a rate equal to the modulation frequency or a multiple or sub-multiple of the modulation frequency.

50. The improvement of claim 49 wherein said at least two counting means are periodically reset by a reset pulse generator triggered at the modulation frequency.

51. The improvement of claim 46 wherein at least two of said plurality of integrally-related sub-multiple frequencies are synchronously synthesized by common digital means used in their synthesis.

52. The improvement of claim 46 wherein said means for digitally mixing said plurality of integrally-related sub-multiple frequencies includes a plurality of exclusive OR gates, and wherein said plurality of integrally-related sub-multiple frequencies are mixed by said plurality of exclusive OR gates in synthesizing said modulated interrogation frequency, and at least two of said plurality of integrally-related sub-multiple frequencies are phased at the inputs of said plurality of exclusive OR gates to offset the transition times of said plurality of sub-multiple frequencies at said inputs.

53. The improvement of claim 52 wherein said plurality of integrally-related sub-multiple frequencies are phased at the inputs of the plurality of exclusive OR gates by delay means at one input of each of said plurality of exclusive OR gates.

54. In a method of generating an interrogation frequency for a physics of an atomic frequency standard from a plurality of integrally-related sub-multiple frequencies derived from an output frequency of the atomic frequency standard, the improvement comprising synchronously synthesizing at least two of the plurality of frequencies, including a frequency-modulated frequency and a modulation frequency of the frequency-modulated frequency.

55. The improvement of claim 54 wherein said at least two frequencies are synthesized by dividing the output frequency with at least two independent counting means, and said at least two frequencies are synthesized synchronously by periodically resetting both said two independent counting means for synchronization with said output frequency.

56. The improvement of claim 55 wherein said two independent counting means are periodically reset at the modulation frequency or a multiple or sub-multiple of the modulation frequency.

57. The improvement of claim 55 wherein said two independent counting means are reset at the modulation frequency synthesized from said output frequency.

58. The improvement of claim 54 wherein said at least two frequencies are synthesized with common digital means.

59. The improvement of claim 58 wherein said at least two frequencies are synthesized by dividing said output frequency using said common digital means.

* * * * *